(12) United States Patent
Girardi

(10) Patent No.: US 11,809,740 B1
(45) Date of Patent: Nov. 7, 2023

(54) FAST AND FLEXIBLE RAM READER AND WRITER

(71) Applicant: STMicroelectronics S.r.l., Agrate Brianza (IT)

(72) Inventor: Walter Girardi, Appiano Gentile (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/663,847

(22) Filed: May 18, 2022

(51) Int. Cl.
| | |
|---|---|
| *G11C 29/04* | (2006.01) |
| *G11C 29/14* | (2006.01) |
| *G11C 29/56* | (2006.01) |
| *G06F 13/00* | (2006.01) |
| *G06F 3/06* | (2006.01) |
| *G11C 7/10* | (2006.01) |
| *G11C 29/00* | (2006.01) |

(52) U.S. Cl.
CPC .......... *G06F 3/0655* (2013.01); *G06F 3/0671* (2013.01); *G11C 7/1036* (2013.01); *G11C 29/00* (2013.01)

(58) Field of Classification Search
CPC ... G06F 3/0655; G06F 3/0671; G11C 7/1036; G11C 29/00
USPC ........................................................ 365/201
See application file for complete search history.

(56) References Cited

U.S. PATENT DOCUMENTS

| | | | | |
|---|---|---|---|---|
| 6,072,737 | A * | 6/2000 | Morgan | G11C 29/14 365/201 |
| 6,865,241 | B1 * | 3/2005 | Adkins | G06F 13/4059 375/372 |
| 2003/0018939 | A1 * | 1/2003 | Kinoshita | G01R 31/318572 714/742 |

OTHER PUBLICATIONS

IEEE—SA Standards Board, "IEEE Standard Test Access Port and Boundary-Scan Architecture", IEEE Std 1149.1-2001 (R2008), (Revision ofIEEEStd 1149.1-1990), Reaffirmed Mar. 27, 2008, Approved Jun. 14, 2001, 208 Pages.
IEEE, "Standard Testability Method for Embedded Core-based Integrated Circuits", International Standard, IEEE 1500TM, IEC 62528, Edition 1.0 Nov. 2007, 130 Pages.

* cited by examiner

*Primary Examiner* — Ly D Pham
(74) *Attorney, Agent, or Firm* — Slater Matsil, LLP

(57) ABSTRACT

A circuit for reading or writing a RAM includes a shift register coupled to the RAM, a test data input, and a test data output. The circuit further includes a control circuit configured to generate a pulse every N clock cycles, each pulse triggering a RAM access operation transferring data between the shift register and the RAM, N being equal to a data width of the RAM divided by a parallel factor, the parallel factor being a number of pins in either the test data input or the test data output configured for parallel data loading.

21 Claims, 19 Drawing Sheets

FAST AND FLEXIBLE RAM READER AND WRITER

TECHNICAL FIELD

The present invention relates generally to methods and apparatuses for writing and reading a random access memory (RAM), and in particular embodiments, to methods and apparatuses for fast access to RAM content during manufacturing testing of a microcontroller device.

BACKGROUND

Some functional features of microcontroller devices may be tested using load RAM tester patterns. However, RAM loading approaches may utilize serial data loading. This can undesirably increase the amount of time needed to perform test operations. Faster RAM accessing devices and methods can expedite testing processes.

SUMMARY

In accordance with an embodiment, a circuit for reading or writing a RAM includes a shift register coupled to the RAM, a test data input, and a test data output. The circuit further includes a control circuit configured to generate a pulse every N clock cycles, each pulse triggering a RAM access operation transferring data between the shift register and the RAM, N being equal to a data width of the RAM divided by a parallel factor, the parallel factor being a number of pins in either the test data input or the test data output configured for parallel data loading.

In accordance with an embodiment, the circuit further includes wherein the control circuit is configured to generate each pulse in accordance with a counter repeating every N clock cycles.

In accordance with an embodiment, the circuit is coupled to a test controller running a finite state machine in accordance with an IEEE 1149.1 standard.

In accordance with an embodiment, the circuit further includes wherein the counter is configured to activate and count in accordance with the finite state machine.

In accordance with an embodiment, the circuit further includes an update register, wherein the RAM access operation includes a data transfer between the shift register and the update register and a data transfer between the update register and the RAM.

In accordance with an embodiment, the circuit further includes wherein the test data input is a serial test data input pin and the test data output is a serial test data output pin, and wherein the parallel factor is 1.

In accordance with an embodiment, the circuit further includes wherein the test data input includes a serial test data input pin and at least one parallel data loading pin, wherein the test data output includes a serial test data output pin and the at least one parallel data loading pin, each of the at least one parallel data loading pin coupled to a section of the shift register via a multiplexer (MUX), and wherein the parallel factor is a number of the at least one parallel data loading pin+1.

In accordance with an embodiment, the circuit further includes wherein the test data input includes at least one parallel data loading pin coupled to a peripheral device, and wherein the parallel factor is a number of the at least one parallel data loading pin.

In accordance with an embodiment, a method to write a RAM includes loading, by a RAM access circuit coupled to the RAM, data from a test data input into a shift register of the RAM access circuit. The method further includes generating, by the RAM access circuit, a pulse every N clock cycles, each pulse triggering a RAM write operation transferring the data loaded into the shift register to the RAM, N being equal to a data width of the RAM divided by a parallel factor, the parallel factor being a number of pins in the test data input configured for parallel data loading.

In accordance with an embodiment, the method further includes wherein the RAM access circuit is configured to generate each pulse in accordance with a counter repeating every N clock cycles.

In accordance with an embodiment, the method further includes wherein the RAM access circuit is coupled to a test controller running a finite state machine in accordance with an IEEE 1149.1 standard.

In accordance with an embodiment, the method further includes wherein the counter is configured to activate and count in accordance with the finite state machine.

In accordance with an embodiment, the method further includes wherein the RAM access circuit includes an update register, and wherein the RAM write operation includes transferring the data from the shift register to the update register and subsequently transferring the data from the update register to the RAM.

In accordance with an embodiment, the method further includes wherein the test data input is a serial test data input pin, and wherein the parallel factor is 1.

In accordance with an embodiment, the method further includes wherein the test data input includes a serial test data input pin and at least one parallel data loading pin, each of the at least one parallel data loading pin coupled to a section of the shift register via a MUX, and wherein the parallel factor is a number of the at least one parallel data loading pin+1.

In accordance with an embodiment, the method further includes wherein the test data input includes at least one parallel data loading pin coupled to a peripheral device, and wherein the parallel factor is a number of the at least one parallel data loading pin.

In accordance with an embodiment, a method to read a RAM includes generating, by a RAM access circuit coupled to the RAM and a test data output, a pulse every N clock cycles, each pulse triggering a RAM read operation loading data from the RAM into a shift register of the RAM access circuit, N being equal to a data width of the RAM divided by a parallel factor, the parallel factor being a number of pins in the test data output configured for parallel data loading. The method further includes transferring, by the RAM access circuit, the data loaded into the shift register to the test data output.

In accordance with an embodiment, the method further includes wherein the RAM access circuit includes an update register, and wherein the RAM read operation includes transferring the data from the RAM to the update register and subsequently transferring the data from the update register to the shift register.

In accordance with an embodiment, the method further includes wherein the test data output includes a serial test data output pin and at least one parallel data loading pin, each of the at least one parallel data loading pin coupled to a section of the shift register via a MUX, and wherein the parallel factor is a number of the at least one parallel data loading pin+1.

In accordance with an embodiment, the method further includes wherein the RAM access circuit is configured to generate each pulse in accordance with a counter repeating every N clock cycles.

In accordance with an embodiment, a device includes a RAM, a processor, and a RAM access circuit. The RAM access circuit includes a shift register coupled to the RAM, a test data input, and a test data output. The RAM access circuit further includes a control circuit configured to generate a pulse every N clock cycles, each pulse triggering a RAM access operation transferring data between the shift register and the RAM, N being equal to a data width of the RAM divided by a parallel factor, the parallel factor being a number of pins in either the test data input or the test data output configured for parallel data loading.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
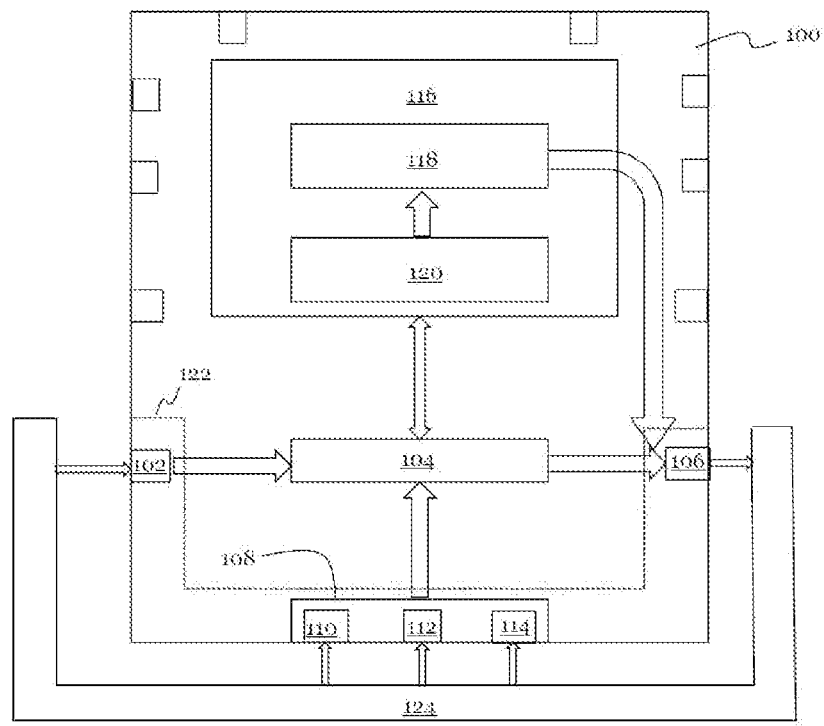
FIG. 1 illustrates a Design For Testing (DFT) system for a system on a chip (SoC)

Integrated circuits have long incorporated embedded components that may lack externally accessible pins. These components, however, just like any other component, may be subject to performance variations for any variety of reasons such as, but not limited, manufacturing and other defects. The need for testing these embedded components, and systems of embedded components, on integrated circuits prompted the development of alternative approaches.

The Joint Test Action Group (JTAG) was formed for addressing these challenges. IEEE 1149.1-2013 contain some relevant standards. Many microcontroller devices now comprise JTAG ports that provide access to internal embedded components for testing, debugging, and fault isolation for embedded systems. These access ports are now used for wide variety of testing and debugging operations on integrated circuits. Some testing operations for microcontroller devices are tested through Load-Ram-Execute ("LRE") tester patterns. This may be true for testing that is not performed with Automatic Testing Pattern Generation or Memory Build in Self Test, and other specific Design for Testability modes. Some, non-limiting, example are consumption measurements with a device in a specific functional configuration, or testing of functional critical paths not covered by Automatic Test Pattern Generation.

LRE patterns and tests may be performed by loading functional code onto a System on a Chip ("SoC"). The code may be loaded onto a system RAM from Automatic Tester Equipment ("ATE") coupled with the SoC for testing purposes. An ATE may be coupled with an interface (such as a JTAG interface) to transmit the data that is transferred to the system RAM. After the system RAM is loaded with the functional code, a CPU for the SoC may execute the functional code. Test result data may be then be provided back to the ATE where the results may be analyzed and evaluated. Some devices under test may generate data at such a high rate that it may not be possible to send the generated data directly back to JTAG pads. Thus, test data may be stored in the system RAM first, and subsequently a DFT architecture may read the test data from the system RAM.

Testing and debugging integrated circuits may be time consuming for various reasons. Some DFT interfaces have only one pin available to load data for a system RAM. As a result, data is loaded serially, which can be extremely slow. A conventional JTAG DFT RAM loader may not support RAM access from peripheral devices such as an analog to digital converter (ADC). Furthermore, a test controller usually comprises a Finite State Machine (FSM) whose outputs and state transitions are determined by a signal received from the test mode select (TMS) input and the clock input. According to the FSM, RAM access is triggered only when the test controller enters an UPDATE-DR state. During continuous data exchange, a subsequent RAM access requires the test controller to change to different states and enters back to the UPDATE-DR state again, which causes unnecessary delay. Therefore, faster and more convenient RAM accessing devices and methods for testing operations are desired.

Aspects of the present disclosure provide embodiment techniques that trigger RAM access operations using a separate pulse signal in addition to control signals from a JTAG test controller. In one embodiment, a circuit for reading or writing a RAM, which may also be called a RAM access circuit, includes a shift register and a control circuit. The shift register is coupled to the RAM, a test data input, and a test data output. The control circuit is configured to generate a pulse every N clock cycles. Each pulse triggers a RAM access operation that transfers data between the shift register and the RAM. N is an integer equal to a data width of the RAM divided by a parallel factor. The parallel factor is a number of pins in either the test data input or the test data output configured for parallel data loading. The embodiment techniques provide faster RAM access to a microcontroller device during manufacturing testing, which may reduce testing time. The embodiment techniques can be applied to JTAG DFT RAM loaders as well as data exchange between a RAM and a peripheral device. Advantages of the embodiment techniques also include reduced size of RAM access circuits because these circuits may be implemented with fewer shift registers, which saves silicon area. The above aspects and other inventive aspects are discussed in greater detail below.

FIG. 1 illustrates a Design For Testing (DFT) system for a system on a chip (SoC). A SoC 100 may comprise a test data input 102. The test data input 102 may be coupled with register block 104. The register block 104 may also be coupled with a test data output 106. The SoC may further comprise a test controller 108. In various embodiments, the test controller 108 may have the following inputs: a clock input no, a test mode select (TMS) 112, and a reset input 114. There may also be additional inputs for the test controller 108. The SoC may further comprise additional pins. The SoC may comprise a microcontroller 116. The microcontroller 116 may comprise a CPU 118 and a System RAM 120. The test data input 102, test data output 106, clock input no, test mode select 112, and reset input 114 may all be disposed at an interface 122 (such as a JTAG interface), where an ATE 124 may be coupled with the SoC 100. The test controller 108 may also comprise the test data input 102 and the test data output 106.

The test controller may comprise a JTAG Test Access Port ("TAP" controller). Accordingly, the test controller 108 may comprise a Finite State Machine whose outputs and state transitions are determined by a signal received from the test mode select 112 and the clock input no. The reset input 114 may reset the state of the test controller 108, as its name indicates.

The register block 104 may store data serially loaded from the test data input 102 depending on control signals received from the test controller 108, which in turn may depend on the state of the test controller 108. The register block may provide data to the test data output 106 depending on the signals received from the test controller.

For Load-Ram-Execute ("LRE") tests, data received from the test data input may be stored in the register block 104. Data may be loaded one bit at a time into a shift register. Subsequently, data may be loaded to the System RAM 120 where it may be executed by the CPU 118 and results may be delivered to the test data output 106. The test data input 102, clock input no, and test mode select 112 may all be coupled with the ATE 124, which can then control LRE tests. The ATE 124 may also be coupled with the test data output 106 to receive the results of any tests performed. And, the ATE 124 may assert a reset signal coupled with the reset input 114 during test operations. While an LRE test is being performed, some or all of the additional pins on the SoC may be unused or otherwise available.

Figure 2:
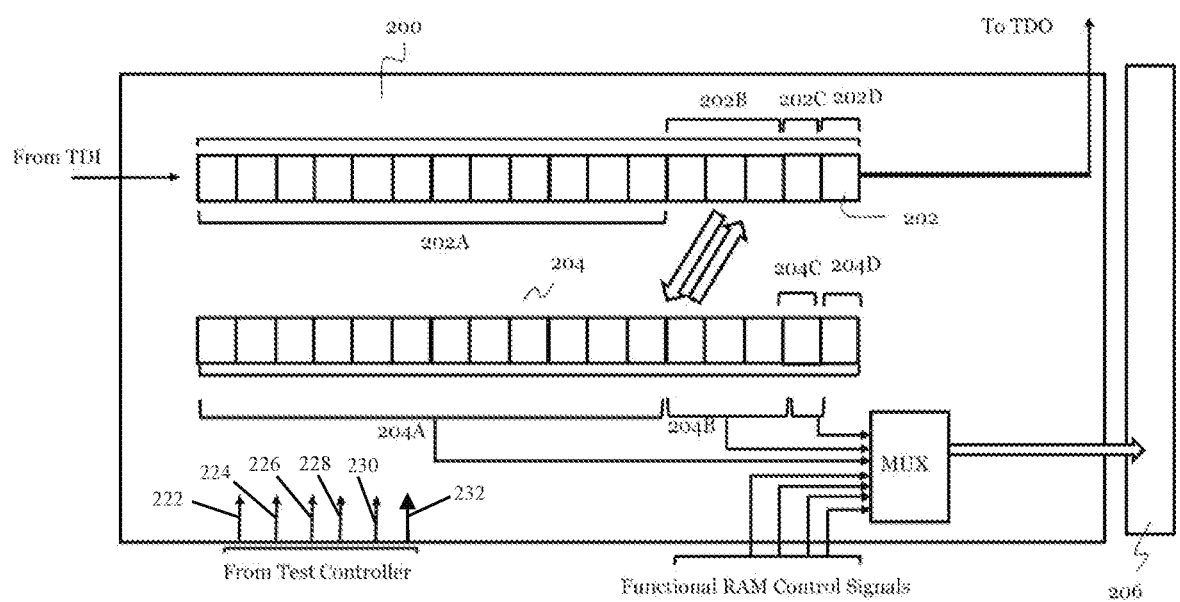
FIG. 2 depicts a register block that loads data from a test data input in a serial manner.

FIG. 2 depicts a register block that loads data from a test data input in a serial manner. The register block 200 includes a shift register 202, and an update register 204. The shift register 202 is also coupled with the test data output 106. The shift register 202 includes data bits 202A, addressing bits 202B, RAM R/W bits 202C, and a MUX enable bit 202D. The update register 204 includes data bits 204A, addressing bits 204B, RAM R/W bits 204C, and a MUX enable bit 204D.

The register block 200 receives control signals 222-232 from a test controller. Data is loaded into the shift register 202 one bit at a time when as directed by control signals received from the test controller. Once loaded, the data is transferred to the update register. A MUX intercepts the functional RAM control signals and toggles them to the signals received from the update register 204. The signals are then delivered to the System RAM 206 where they can be executed.

The register block 200 may receive a data-register enable signal 222. The data-register enable signal 222 may be active when a specific instruction from test controller is loaded. For example, the register block 200 may exchange data with a test controller (TDI from test controller, TDO to test controller). Otherwise, the test controller may interact with other registers of a SoC, different from the ones related to the flexible RAM loader. The register block 200 may also receive an UPDATE signal 224. When asserted, the UPDATE signal may cause data from the shift register 202 to be loaded to the update register 204. The register block 200 may also receive a SHIFT signal 226. When asserted the SHIFT signal may cause data to be loaded into the shift register 202. This may occur as data is shifted out of the shift register. For example, data may be shifted in from TDI and out TDO, simultaneously. Depending on the other configurations of the register block 200, data shift may occur serially or in parallel. The register block 200 may also receive a CAPTURE signal 228. When asserted, the CAPTURE signal 228 may cause data from the update register 204 to be transferred into the shift register 202. The register block 200 may also receive a RESET signal 230. The RESET signal, when asserted may cause the removal of the data stored in the shift register. The register block 200 may also receive a clock signal 232 from the test controller, which may originate from an ATE. As will be appreciated these control signals may be asserted and de-asserted depending on the state of the test controller 108.

Figure 3:
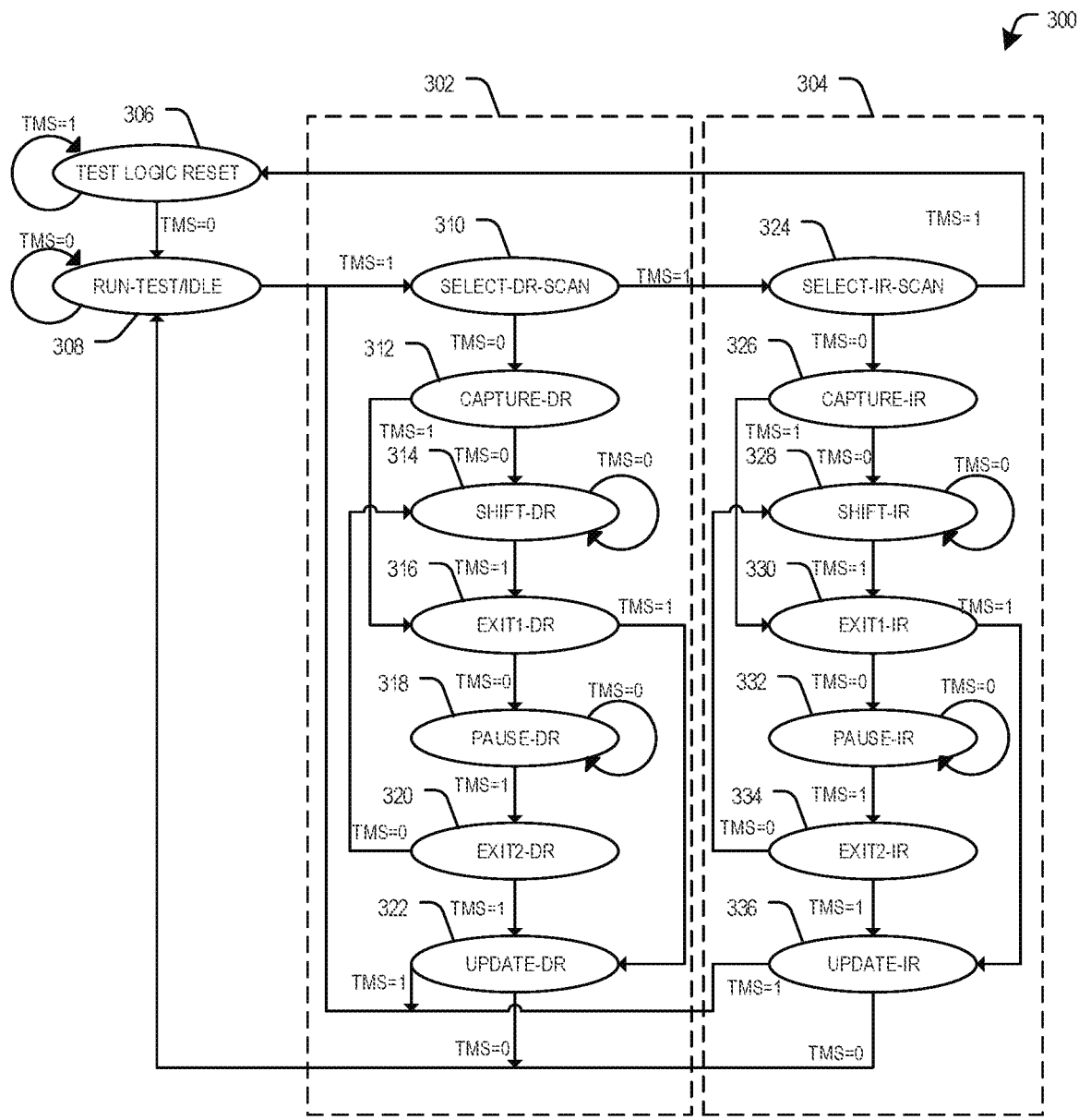
FIG. 3 depicts a state transition diagram of a Test Access Port (TAP) controller Finite State Machine (FSM)

FIG. 3 depicts a state transition diagram of a TAP controller FSM. As shown in FIG. 3, JTAG operations may be controlled by a 16-state FSM 300 whose state transitions are triggered by a test mode select (TMS) signal (such as the TMS 112 in FIG. 1). The TAP controller (or test controller or JTAG test controller) may change state at a rising edge of the clock signal, and the next state may be determined by the logic level of the TMS signal and the present state. The test controller may produce various control signals depending on the FSM's state.

The FSM has two similar control paths for different registers: a path 302 for a data register (DR) and a path 304 for an instruction register (IR). The test controller may be initialized by the reset input and start from a TEST LOGIC RESET state 306. From the TEST LOGIC RESET state 306, the test controller moves to a RUN-TEST/IDLE state 308 when TMS is at low level (value 0) or stays in the TEST LOGIC RESET state 306 when TMS is at high level (value 1). From the RUN-TEST/IDLE state 308, the test controller may move to a SELECT-DR-SCAN state 310 when TMS is high. From the SELECT-DR-SCAN state 310, the test controller starts the DR path 302 and moves to a CAPTURE-DR state 312 when TMS is low, or starts the IR path 304 and moves to a SELECT-IR-SCAN state 324 when TMS is high. When the test controller moves to the CAPTURE-DR state 312, data register is enabled and the CAPTURE signal (control signal 228 in FIG. 2) for the data register is produced. From the CAPTURE-DR state 312, the test controller may move to an EXIT1-DR state 316 when TMS is high, or move to a SHIFT-DR state 314 and produce the SHIFT signal 226 when TMS is low. From the SHIFT-DR state 314, the test controller may move to the EXIT1-DR state 316 when TMS is high. From the EXIT1-DR state 316, the test controller moves to an UPDATE-DR state 322 when TMS is high or moves to a PAUSE-DR state 318 when TMS is low. The test controller produces the UPDATE signal 224 when moving to the UPDATE-DR state 322. From the PAUSE-DR state 318, the test controller may move to an EXIT2-DR state 320 when TMS is high. From the EXIT2-DR state 320, the test controller moves to the SHIFT-DR state 314 when TMS is low or moves to the UPDATE-DR state 322 when TMS is high. From the UPDATE-DR state 322, the test controller moves to the SELECT-IR-SCAN state 324 when TMS is high or returns to the RUN-TEST/IDLE state 308 when TMS is low. The IR path 304 includes transitions between states 324-336, which are similar to those described above with respect to the DR path 302.

Figure 4:
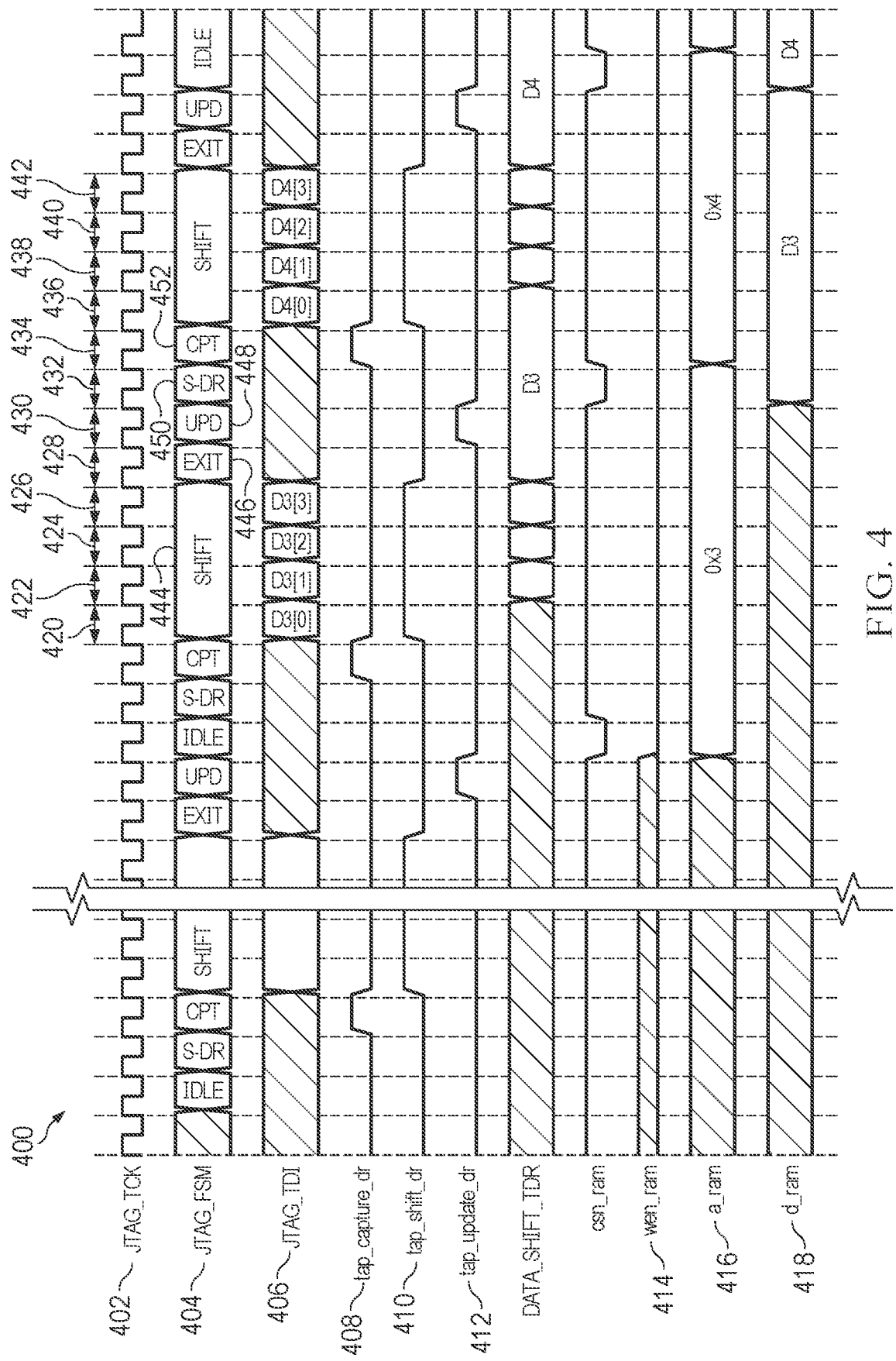
FIG. 4 depicts RAM write operations performed by a conventional Joint Test Action Group (JTAG) RAM loader.

FIG. 4 depicts RAM write operations performed by a conventional JTAG RAM loader. The waveforms and signals depicted in FIG. 4 may correspond to loading data from a serial test data input pin to a system RAM performed by a DFT system (such as a DFT system illustrated in FIG. 1 including a register block illustrated in FIG. 2).

In this example, a data width of the system RAM is 4-bit. A clock signal 402 may be provided by an ATE to clock input no. A state signal 404 depicts the state of a test controller (such as the test controller 108), which may comprise a TAP controller. As referenced earlier the states of the test controller 108 may depend on the inputs to the test controller 108 from an ATE and the progression of the clock. A test data input signal 406 corresponds to data received from the test data input (such as the test data input 102). A CAPTURE signal 408, a SHIFT signal 410, and an UPDATE signal 412 are control signals generated by the test controller based on a conventional JTAG FSM as described in FIG. 3. Writing to the system RAM is enabled when a RAM write enable bit 414 is set at low level. A RAM address signal 416 may provide the RAM address (the location where the data is being loaded), which may be derived from addressing bits 204B. In a first RAM write operation, the addressing information may come directly from addressing bits 204B. In the subsequent RAM write operations, the addressing information may be automatically increased by 1 after each RAM write. A RAM data signal 418 illustrates data loaded into the system RAM, which may directly come from data bits 204A.

FIG. 4 shows two consecutive RAM write operations that load data blocks D3 and D4 (the size of each is 4-bit) from JTAG input to the system RAM. Three JTAG accesses may be required in these two RAM write operations. The first JTAG access may load the start address (0x3), and set the next operation mode and operation type W (W means RAM write operations).

The second JTAG access may load the data block D3 to address 0x3 of the RAM. During clock cycles 420-426, the test controller stays in a SHIFT-DR state 444, and the data block D3 is loaded in serial from the serial test data input pin to a shift register (such as the shift register 202 in FIG. 2). Then the test controller may cycle through an EXIT1-DR state 446, an UPDATE-DR state 448, a SELECT-DR-SCAN state 450, and a CAPTURE-DR state 452. When the test controller moves to the UPDATE-DR state 448, the test controller produces the UPDATE signal 412, which may be a pulse at clock cycle 430. The UPDATE signal 412 triggers the first RAM write operation starting from clock cycle 432. The first RAM write operation includes transferring the data block D3 stored in the shift register to an update register (such as the update register 204 in FIG. 2), and transferring the data from the update register to the system RAM.

The third JTAG access may load the data block D4 to address 0x0 (start address+1) of the RAM. The test controller may move to the SHIFT-DR state again, and the data block D4 is loaded from the serial test data input pin to the shift register during clock cycles 436-442. After that, the test controller may go through the EXIT1-DR state and the UPDATE-DR state once again. When the test controller moves to the UPDATE-DR state the second time, the UPDATE signal is produced, which triggers the second RAM write operation, which may include transferring the data block D4 stored in the shift register to the update register and transferring the data from the update register to the system RAM.

Time may be wasted by a conventional JTAG RAM loader due to the state transitions the test controller needs to go through in between two consecutive JTAG accesses. As shown in FIG. 4, after clock cycle 426 the data block D3 has been loaded to the shift register. But the next data block D4 cannot be loaded immediately and the shift register has to wait 4 extra clock cycles. According to the state transition of the JTAG TAP controller FSM, the test controller still needs to pass through the EXIT1-DR state, the UPDATE-DR state, the SELECT-DR-SCAN state, and the CAPTURE-DR slate before returning to the SHIFT-DR state. Thus, writing M data blocks to the system RAM by the conventional JTAG RAM loader may require a total number of M times RAM data width+4 times (M-1) clock cycles. As such, triggering RAM access operations via a separate pulse signal may increase efficiency of the RAM access in LRE tests.

Figure 5:
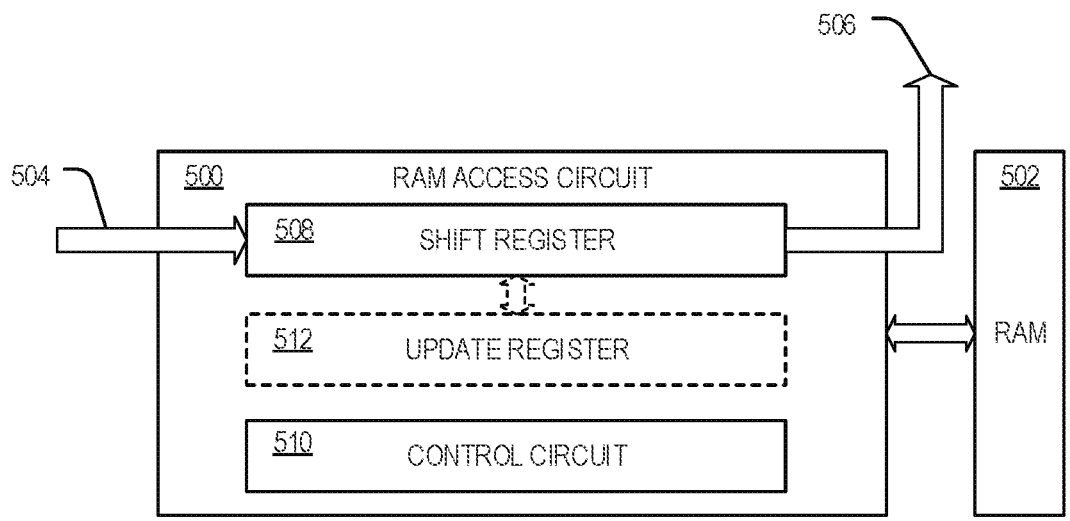
FIG. 5 illustrates an embodiment RAM access circuit for performing the proposed techniques.

FIG. 5 illustrates an embodiment RAM access circuit for performing the proposed techniques. A RAM access circuit 500 includes a shift register 508 and a control circuit 510. The shift register 508 is coupled to a test data input 504, a test data output 506, and a RAM 502. The control circuit 510 is configured to generate a pulse every N clock cycles. Each pulse triggering a RAM access operation transferring data between the shift register 508 and the RAM 502. N is equal to a data width of the RAM 502 divided by a parallel factor. The parallel factor is a number of pins in either the test data input 504 or the test data output 506 configured for parallel data loading. Optionally, the RAM access circuit 500 may include or may be coupled to some other circuits. For instance, the RAM access circuit 500 may include another register 512 coupled to the shift register 508. In another example, the RAM access circuit 500 may be coupled to a test controller (not shown in FIG. 5).

Figure 6:
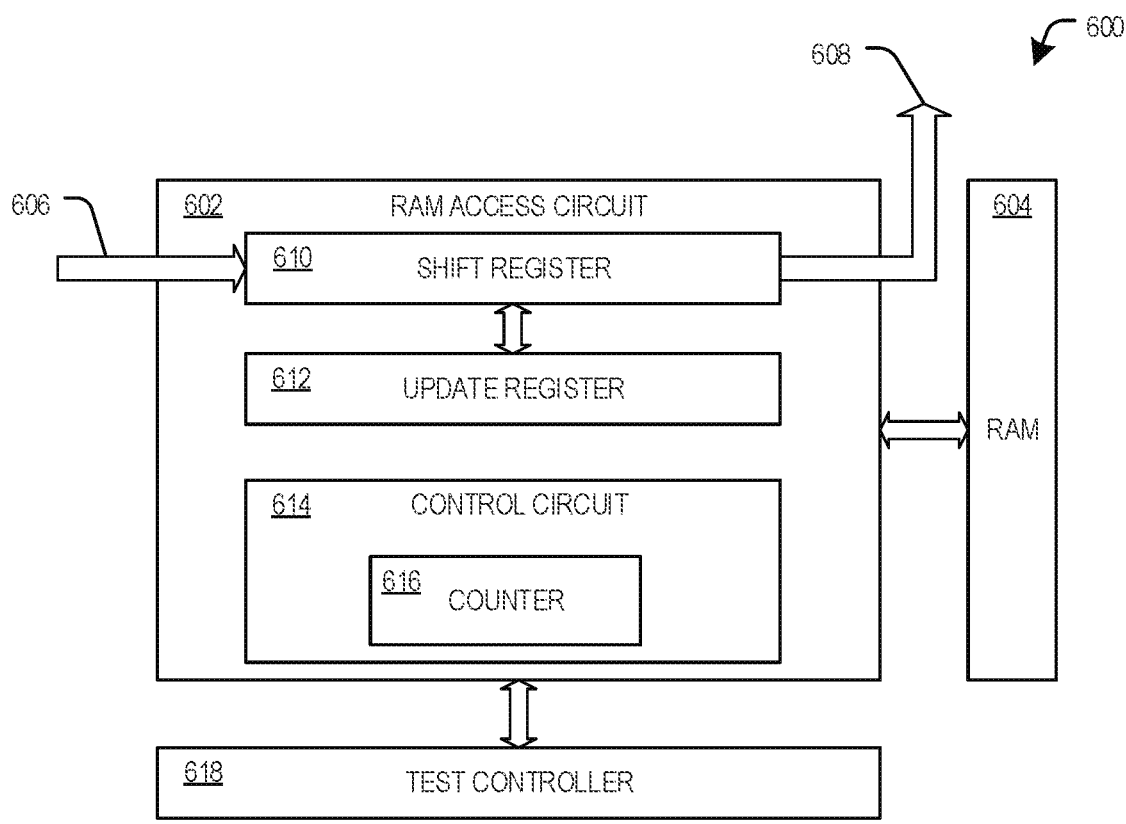
FIG. 6 illustrates another embodiment RAM access circuit for performing the proposed techniques.

FIG. 6 illustrates another embodiment RAM access circuit for performing the proposed techniques. A DFT system 600 includes a RAM access circuit 602 coupled to a RAM 604 and to a test controller 618. The test controller 618 may run a FSM in accordance with an IEEE 1149.1 standard as illustrated in FIG. 3. The RAM access circuit 602 includes a shift register 610, an update register 612, and a control circuit 614. The shift register 610 is coupled to a test data input 606 and a test data output 608.

In various embodiments, the control circuit 614 may include a counter 616 and is configured to generate a pulse every N clock cycles in accordance with the counter 616. Each pulse triggers a RAM access operation transferring data between the shift register 610 and the RAM 604. N is equal to a data width of the RAM 604 divided by a parallel factor. The parallel factor is a number of pins in either the test data input 606 or the test data output 608 configured for parallel data loading.

In various embodiments, the counter 616 is configured to repeat every N clock cycles. The counter 616 may be configured to activate and count in accordance with the FSM of the test controller 618.

Figure 7:
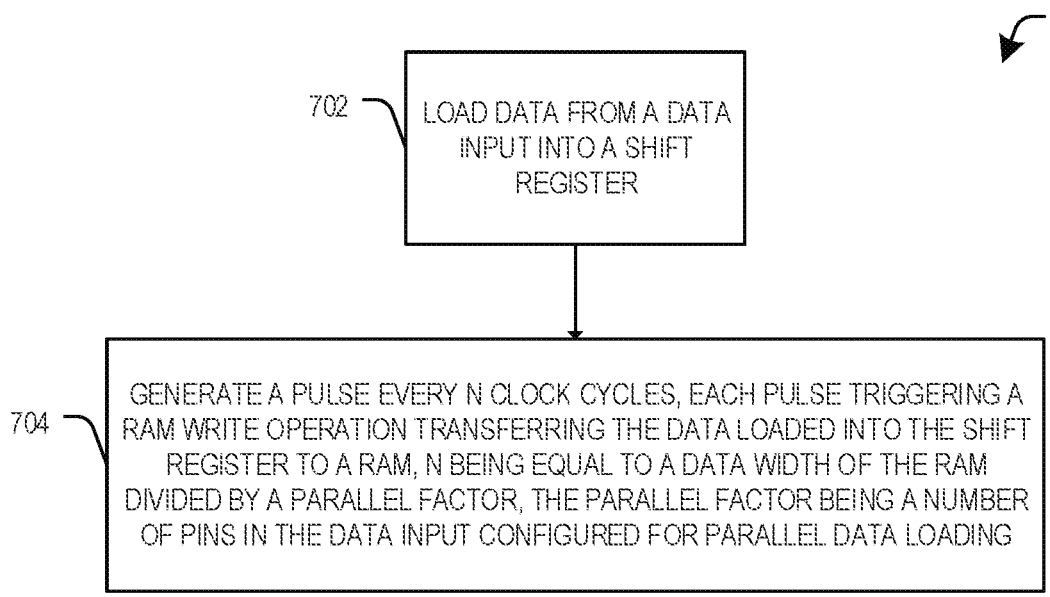
FIG. 7 illustrates an embodiment method to write a RAM.

FIG. 7 illustrates an embodiment method to write a RAM. The embodiment method may be performed by the RAM access circuit 500 in FIG. 5, or the RAM access circuit 602 in FIG. 6, or any other devices in consistent with the embodiment techniques proposed in the present disclosure. The method 700 begins at step 702, where a RAM access circuit coupled to the RAM loads data from a test data input into a shift register of the RAM access circuit. The method 700 proceeds to step 704, where the RAM access circuit generates a pulse every N clock cycles. Each pulse may trigger a RAM write operation transferring the data loaded into the shift register to the RAM. N is equal to a data width of the RAM divided by a parallel factor. The parallel factor is a number of pins in the test data input configured for parallel data loading.

Figure 8:
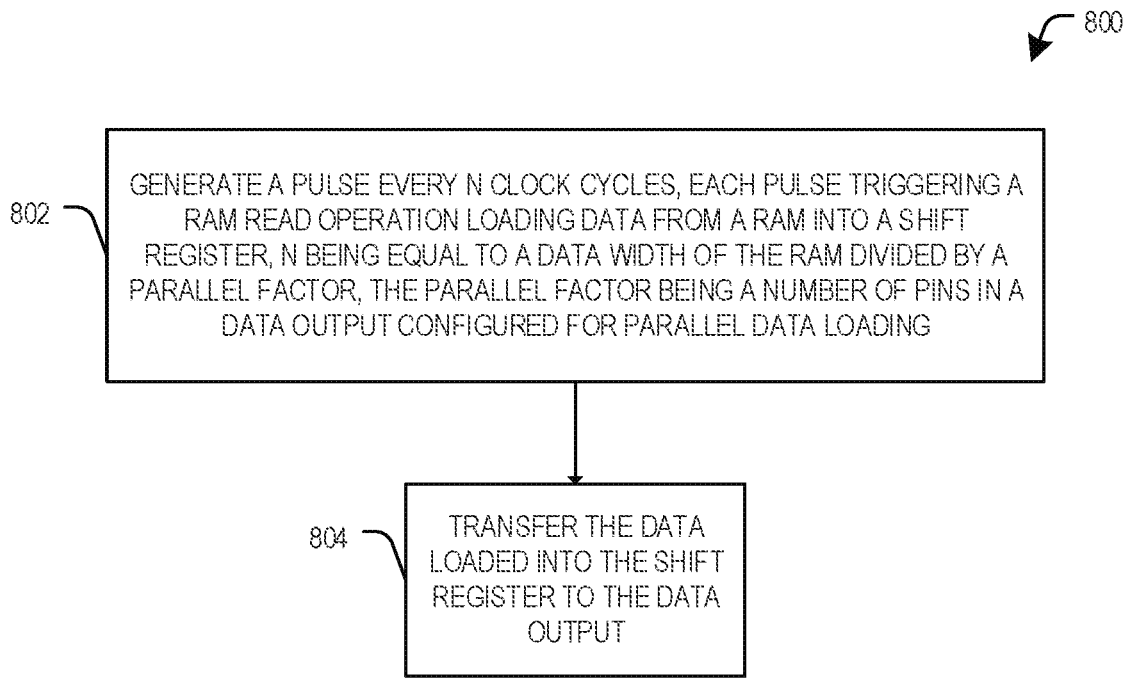
FIG. 8 illustrates an embodiment method to read a RAM.

FIG. 8 illustrates an embodiment method to read a RAM. The embodiment method may be performed by the RAM access circuit 500 in FIG. 5, or the RAM access circuit 602 in FIG. 6, or any other devices in consistent with the embodiment techniques proposed in the present disclosure. The method 800 begins at step 802, where a RAM access circuit coupled to the RAM and a test data output generates a pulse every N clock cycles. Each pulse triggers a RAM read operation loading data from the RAM into a shift register of the RAM access circuit. N is equal to a data width of the RAM divided by a parallel factor. The parallel factor is a number of pins in the test data output configured for parallel data loading. The method 800 proceeds to step 804, where the RAM access circuit transfers the data loaded into the shift register to the test data output.

In various embodiments, the RAM access circuit further includes an update register. The RAM access operation may include a data transfer between the shift register and the update register and a data transfer between the update register and the RAM. For a RAM access circuit that is configured to write the RAM, the RAM access operation may be a RAM write operation. The RAM write operation may include transferring the data from the shift register to the update register and subsequently transferring the data from the update register to the RAM. For a RAM access circuit that is configured to read the RAM, the RAM access operation may be a RAM read operation. The RAM read operation may include transferring the data from the RAM to the update register and subsequently transferring the data from the update register to the shift register.

In various embodiments, the test data input may have only one serial test data input pin. The test data output may have only one serial test data output pin. In these scenarios, the parallel factor is 1. Thus, N is equal to the data width of the RAM.

Figure 9A:
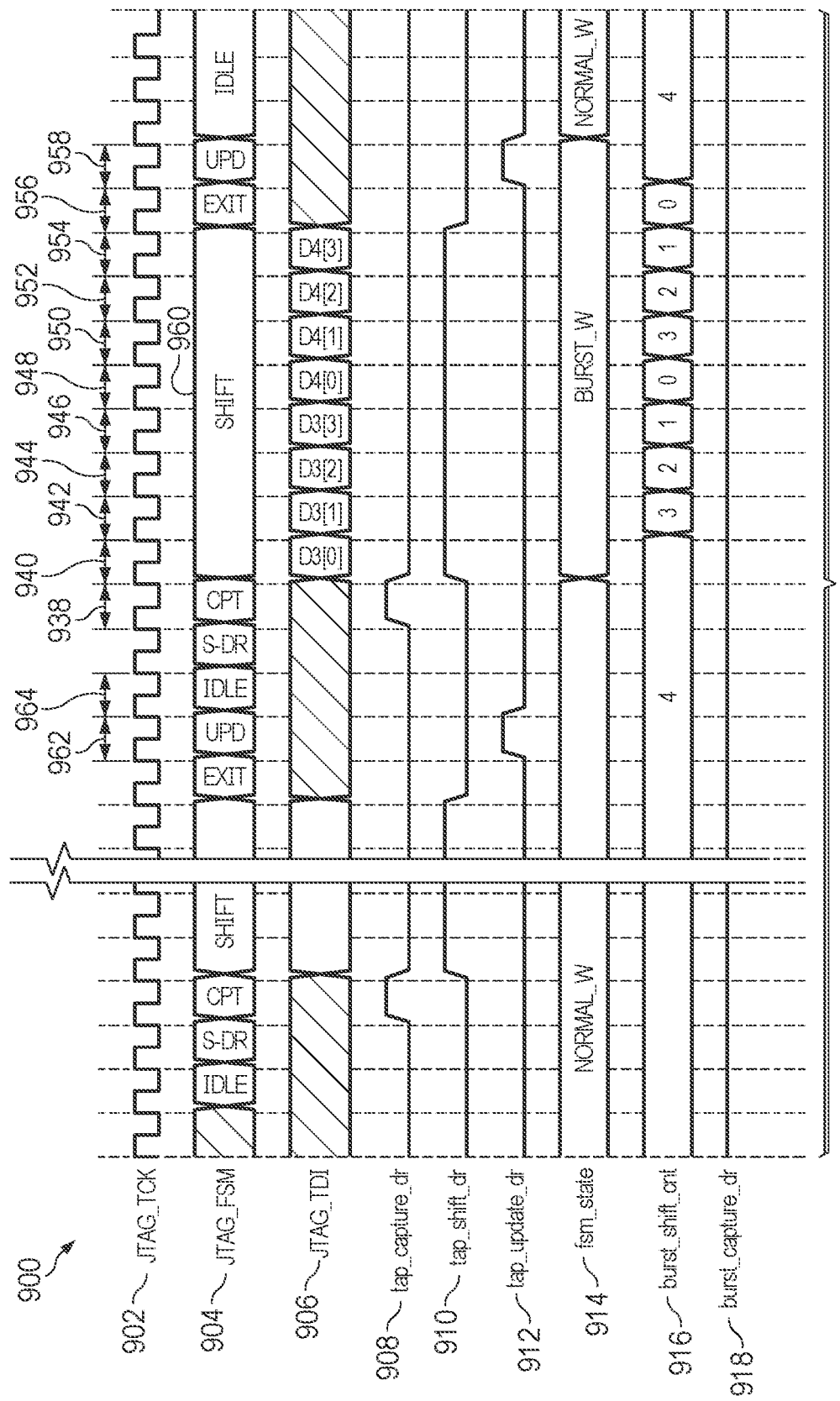
FIGS. 9A-B illustrate embodiment techniques for writing a RAM via a serial test data input pin.
Figure 9B:
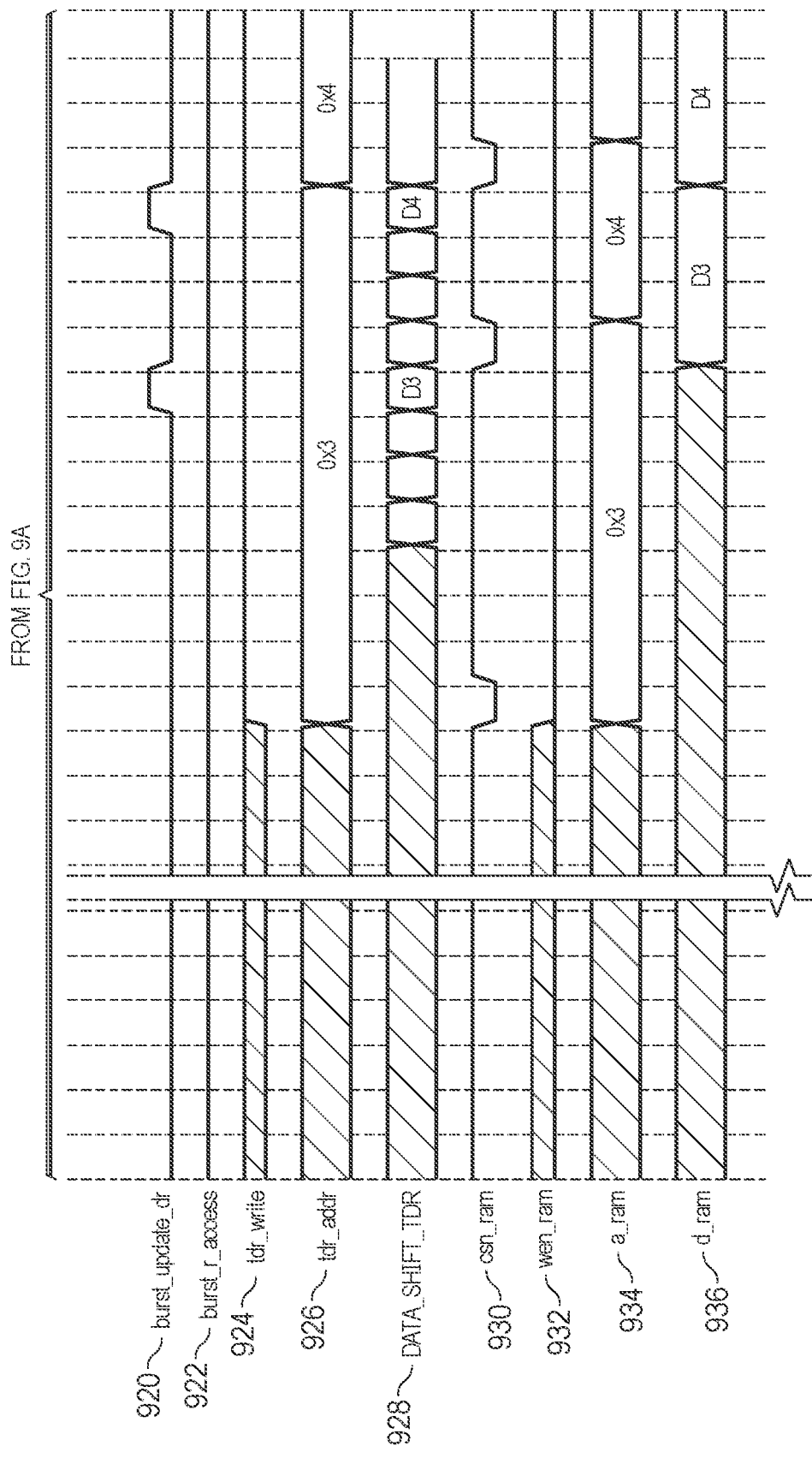

FIGS. 9A-B illustrate an embodiment method for writing a RAM via a serial test data input pin. The signals and waveforms depicted in FIGS. 9A-B may correspond to writing data from a serial test data input pin to a RAM by the RAM access circuit 602 in FIG. 6 or any other devices in consistent with the embodiment techniques proposed in the present disclosure. The RAM's data width is 4-bit. A clock signal 902 may be provided by an ATE to clock input no. A JTAG FSM signal 904 depicts the state of a test controller (such as the test controller 618 in FIG. 6). In this embodiment, the test data input (such as the test data input 606 in FIG. 6) only includes one serial test data input pin. A serial test data input signal 906 illustrates data received from the serial test data input pin. A CAPTURE signal 908, a SHIFT signal 910, and an UPDATE signal 912 are control signals generated by the test controller based on the JTAG FSM described in FIG. 3.

A state signal 914 indicates a running mode of the RAM access circuit. If control signals from the test controller are used to trigger RAM write operations, the running mode is NORMAL_W. If control signals from the test controller are used to trigger RAM read operations, the running mode is NORMAL_R. If signals generated by a control circuit (such as the control circuit 614 in FIG. 6) are used to trigger RAM write operations, the running mode is BURST_W. If signals generated by the control circuit are used to trigger RAM read operations, the running mode is BURST_R.

A counter signal 916 indicates a current value of a counter in the control circuit (such as the counter 616 in FIG. 6). A burst update signal 920 is generated by the control circuit. The burst update signal 920 is a pulse signal containing at least one pulse configured to trigger a RAM write operation. A shift register signal 928 illustrates contents of the shift register. A Chip Select Negative (CSN) signal 930 acts as an enable signal for the RAM. Access to the RAM may not be allowed when the CSN signal 930 is high. Conversely, if the CSN signal 930 is low, a RAM access (either write or read) operation may occur. Writing to the RAM is enabled when a RAM write enable bit 932 is set at low level. A RAM address signal 934 may provide the RAM address (the location where the data is being loaded), which may be derived from addressing bits 204B initially and automatically increased by 1 after each RAM write operation. A RAM data signal 936 illustrates content of the RAM.

In this example, the RAM's data width is 4-bit. The RAM access circuit is loading data blocks D3 and D4 from the serial test data input to the RAM. D3 and D4 both have 4 bits. The RAM access circuit runs in NORMAL_W mode before clock cycle 940. The first RAM write operation is triggered by the UPDATE signal 912 at clock cycle 962. As such, the start address 0x3 is loaded to the RAM address signal 934 at the subsequent clock cycle 964.

The RAM access circuit changes to BURST_W mode during clock cycles 940-958. During these clock cycles, RAM write operations may be triggered by the burst update signal 920 generated by the control circuit. Pulses in the burst update signal 920 are produced in accordance with the counter. This counter may be carefully designed to determine an appropriate clock cycle to sample and load data from the shift register to the RAM. Such a process may save the unnecessary clock cycles required by the conventional JTAG RAM loading to pass through the UPDATE-DR state (as illustrated in FIG. 4).

As shown in FIGS. 9A-B, an initial value of the counter is set to 4, which is equal to the data width of the RAM. During clock cycles 940-954, the test controller moves to and stays in a SHIFT-DR state 960. Thus, data blocks D3 and D4 are loaded from the serial test data input pin to the shift register. When the test controller moves to the SHIFT-DR state 960 at clock cycle 940, the counter is activated and counts down by 1 after each clock cycle. At clock cycle 948, the entire data block D3 is loaded into the shift register. At the same clock cycle, the counter becomes 0, which triggers the control circuit to produce a pulse in the burst update signal 920. The pulse triggers the second RAM write operation in the next clock cycle 950. The CSN signal 930 changes from high to low to allow access to the RAM. The second RAM write operation loads the data block D3 from the shift register to the RAM. The second RAM write operation may include transferring the data block D3 stored in the shift register to an update register (such as the update register 204 in FIG. 2 or the update register 612 in FIG. 6), and then transferring the data from the update register to the RAM.

During clock cycles 948-954, the test controller is still in the SHIFT-DR state. Thus, the subsequent data block D4 can be loaded from the serial test data input pin to the shift register without any delay. At clock cycle 950, the counter resets to 3 and starts counting down again. At clock cycle 956, the counter becomes 0, and once again triggers the control circuit to produce another pulse in the burst update signal 920. By the end of the clock cycle 956, the transfer of the data block D4 from the serial test data input pin to the shift register has been completed. The pulse in the burst update signal 920 at clock cycle 956 triggers the third RAM write operation in clock cycle 958. The third RAM write operation loads the data block D4 from the shift register to the system RAM. Similar to the second RAM write operation, the third RAM write operation may also include transferring the data block D4 stored in the shift register to the update register, and then transferring the data from the update register to the RAM.

Figure 10A:
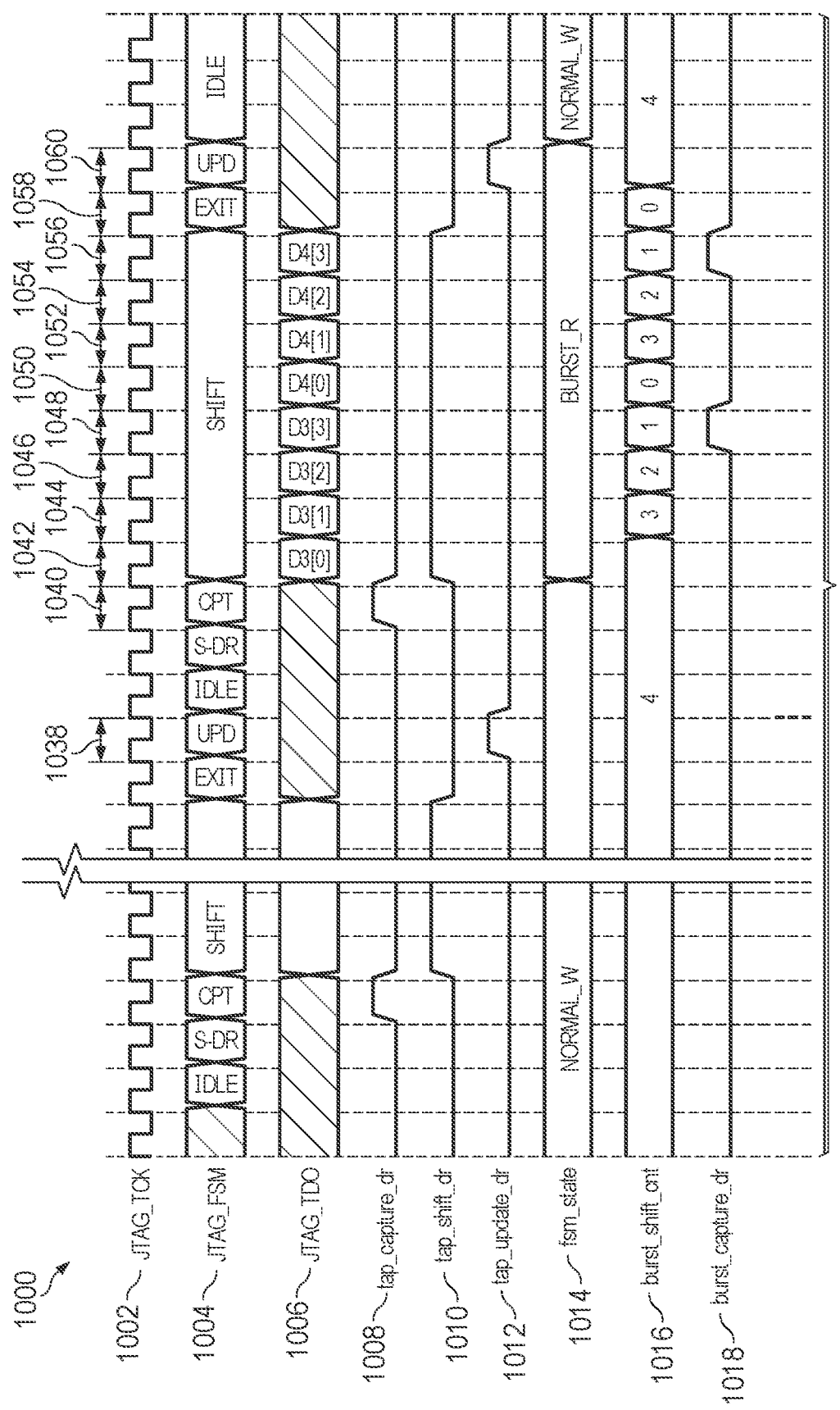
FIGS. 10A-B illustrate embodiment techniques for reading a RAM via a serial test data output pin.
Figure 10B:
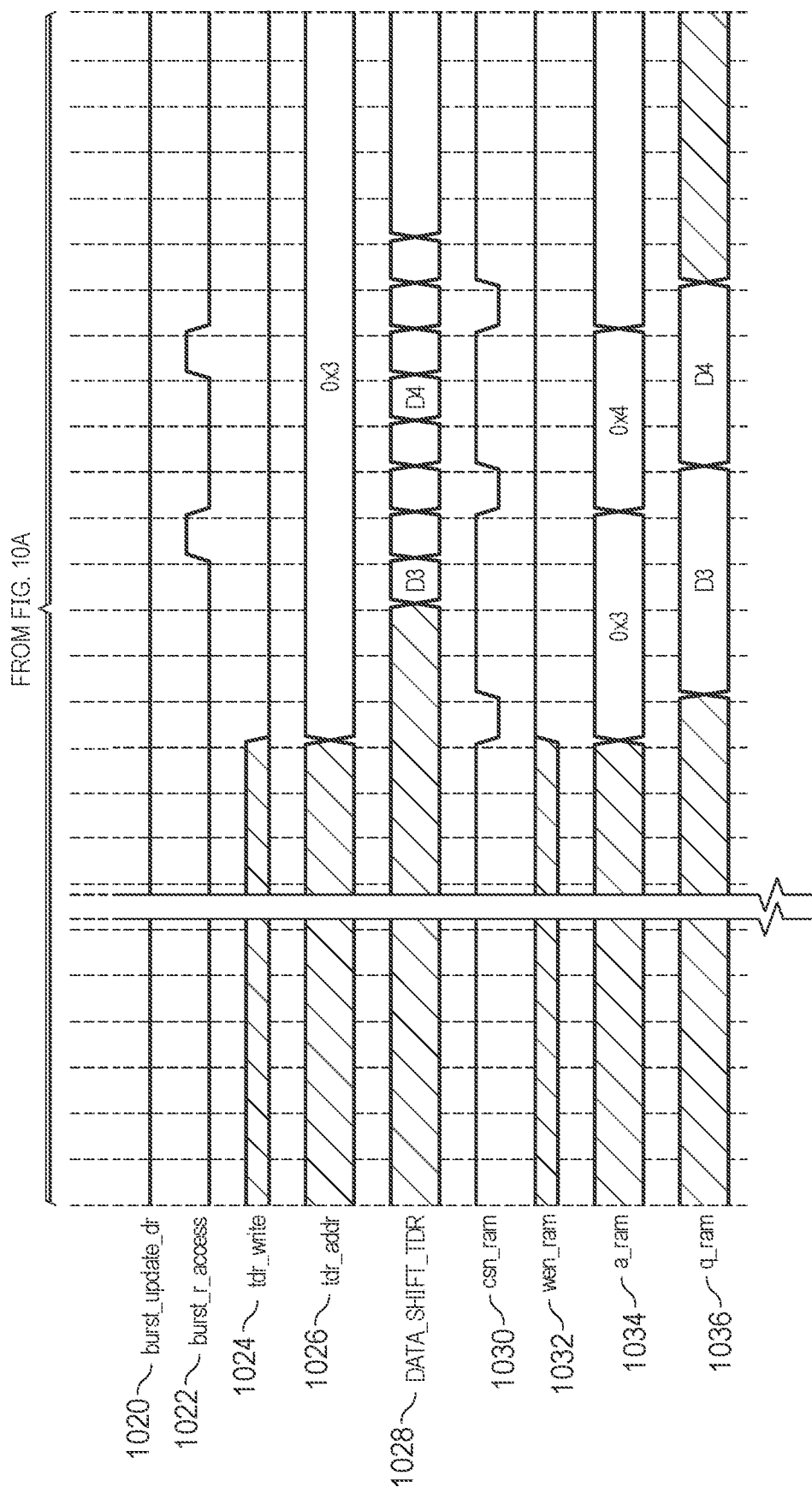

FIGS. 10A-B illustrate an embodiment method for reading a RAM via a serial test data output pin. The signals and waveforms depicted in FIGS. 10A-B may correspond to reading data from the RAM and output to a serial test data output pin by the RAM access circuit 602 in FIG. 6 or any other devices in consistent with the embodiment techniques proposed in the present disclosure. The RAM's data width is 4-bit. FIGS. 10A-B show a clock signal 1002 and a JTAG FSM signal 1004. In this embodiment, the test data output only includes one serial test data output pin. A serial test data output signal 1006 illustrates data outputted to the serial test data output pin. A CAPTURE signal 1008, a SHIFT signal 1010, and an UPDATE signal 1012 are control signals generated by the test controller based on the JTAG FSM described in FIG. 3.

A state signal 1014 indicates a running mode of the RAM access circuit. A signal 1016 indicates a current value of a counter in the control circuit. A burst capture signal 1018 and a burst read access signal 1022 are two pulse signals generated by the control circuit. The burst capture signal 1018 is configured to trigger the shift register to shift data to the test data output. The burst read access signal 1022 is configured to trigger a RAM read operation. A shift register signal 1028 illustrates contents of the shift register. A CSN signal 1030 acts as an enable signal for the RAM. A RAM write enable bit 1032 indicates whether writing to the RAM is enabled. A RAM address signal 1034 may provide the RAM address. A RAM data signal 1036 illustrates content of the RAM.

In this example, the RAM's data width also is 4-bit. The RAM access circuit is reading data blocks D3 and D4 located at addresses 0x3 and 0x0 of the RAM. D3 and D4 both have 4 bits. The RAM access circuit runs in NORMAL_W mode before clock cycle 1042. At clock cycle 1038, the test controller moves to an UPDATE-DR state and generates the UPDATE signal 1012. The UPDATE signal 1012 triggers the first RAM read operation, which loads the data block D3 from the RAM to the shift register. The first RAM read operation may include transferring D3 from the RAM to the update register and subsequently transferring D3 from the update register to the shift register. At clock cycle 1040, the test controller moves to a CAPTURE-DR state and generates the CAPTURE signal 1008. The CAPTURE signal 1008 triggers the shift register to shift D3 to the serial test data output pin during clock cycles 1042-1048. The test controller stays in the SHIFT-DR state during clock cycles 1042-1056.

As shown in FIGS. 10A-B, an initial value of the counter is set to 4, which is equal to the data width of the RAM. At clock cycle 1042, the running mode of the RAM access circuit changes to BURST_R, which activates the counter. The counter starts to count down by 1 after each clock cycle. At clock cycle 1044, the counter becomes 3, which triggers the control circuit to generate a pulse in the burst read access signal 1022. This pulse triggers the second RAM read operation at clock cycle 1046, which loads the data block D4 from the RAM to the shift register. The second RAM read operation may include transferring D4 from the RAM to the update register and subsequently transferring D4 from the update register to the shift register. At clock cycle 1048, the entire data block D3 is shifted from the shift register to the serial test data output. At the same clock cycle, the counter becomes 1, which triggers the control circuit to produce a pulse in the burst capture signal 1018. This pulse triggers the shift register to shift the data block D4 to the serial test data output, which takes 4 clock cycles 1050-1058.

Figure 11:
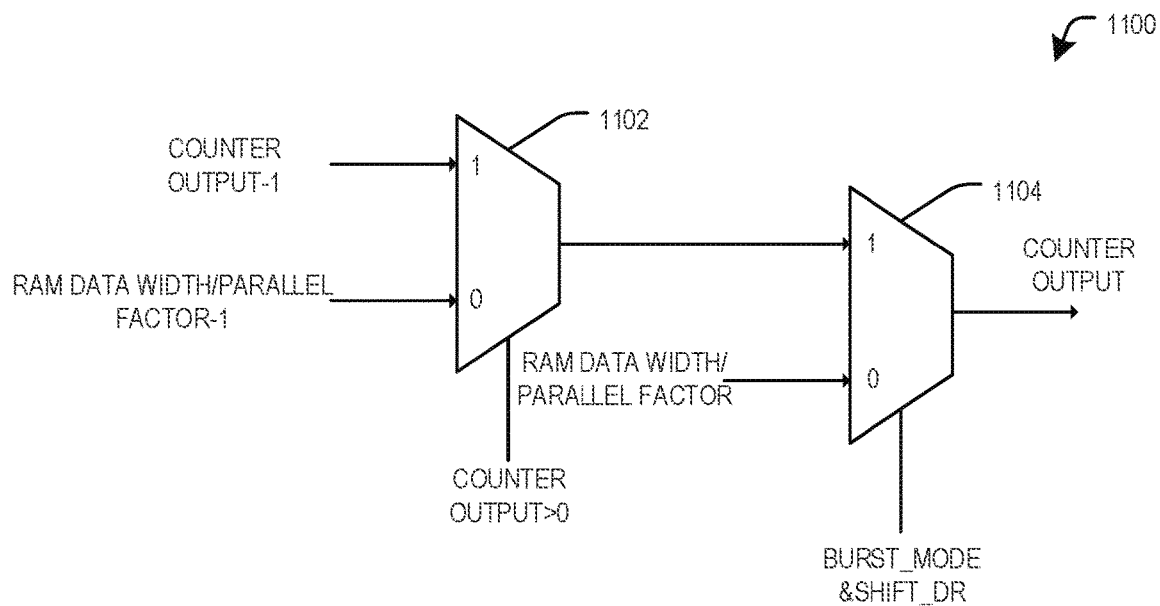
FIG. 11 illustrates an embodiment implementation of a counter used in the proposed techniques.

FIG. 11 illustrates an embodiment implementation of a counter used in the proposed techniques. As shown in FIG. 11, the counter may be implemented as a shift counter 1100. The shift counter 1100 may include two multiplexers 1102 and 1104 coupled together. The multiplexer 1102 has two inputs: output of the shift counter 1100 and N-1. N is the integer described above, which is equal to the data width of the RAM divided by the parallel factor. If the output of the shift counter 1100 is larger than 0, the multiplexer 1102 outputs the output of the shift counter 1100-1. Otherwise, the multiplexer 1102 outputs N-1. The multiplexer 1102's output is coupled to one input of the multiplexer 1104. The other input of the multiplexer 1104 is N. If the RAM access circuit is running in BURST mode (the state signal 914 or 1014 is BURST_W or BURST_R) and the test controller is in the SHIFT-DR state, then the multiplexer 1104 outputs the multiplexer 1102's output. Otherwise, the multiplexer 1104 outputs N.

Figure 12:
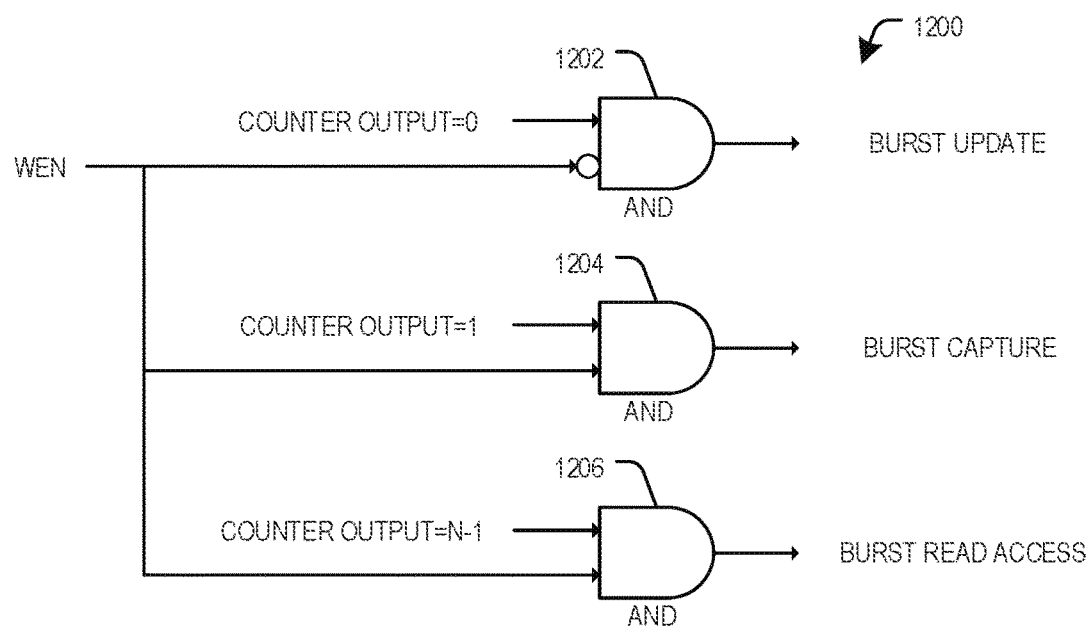
FIG. 12 illustrates an embodiment implementation of a control circuit used in the proposed techniques.

FIG. 12 illustrates an embodiment implementation of a control circuit used in the proposed techniques. As shown in FIG. 12, the control circuit 1200 includes three AND gates 1202, 1204, and 1206. Three separate pulse signals are generated in accordance with an output of a counter (such as the counter 616 illustrated in FIG. 6) and a RAM write enable bit WEN (such as the RAM write enable bit 932 or 1032). When the counter is 0, a burst update signal (such as the burst update signal 920) is produced, whose value is NOT(WEN). NOT is a logical operation. Here, if WEN is set to low level, the burst update signal is at high level. If WEN is set to high level, the burst update signal is at low level. A pulse in the burst update signal may trigger a RAM write operation as illustrated in FIGS. 9A-B. When the counter is 1, a burst capture signal is produced, whose value is the same as WEN. A pulse in the burst capture signal may trigger the shift register to shift data to the test data output in the next clock cycle as illustrated in FIGS. 10A-B. When the counter is N-1, a burst read access signal is produced, whose value also is the same as WEN. A pulse in the burst read access signal may trigger a RAM read operation in the next clock cycle as illustrated in FIGS. 10A-B.

In alternative embodiments, the test data input or the test data output of the RAM access circuit may include extra pins in addition to the serial test data input pin and the serial test data output pin. The extra pins may be used together with the serial test data input/output pin for parallel RAM data loading, such as those described in U.S. patent application Ser. No. 17/580,458, entitled "Methods and Devices for Flexible RAM Loading" and filed on Jan. 20, 2022, which is hereby incorporated herein by reference as if reproduced in its entirety.

In various embodiments, the test data input includes a serial test data input pin and at least one parallel data loading pin. Each of the at least one parallel data loading pin is coupled to a section of the shift register via a multiplexer (MUX). The parallel factor is a number of the at least one parallel data loading pin+1. In various embodiments, the test data output includes a serial test data output pin and the at least one parallel data loading pin. The parallel factor is a number of the at least one parallel data loading pin+1.

Figure 13A:
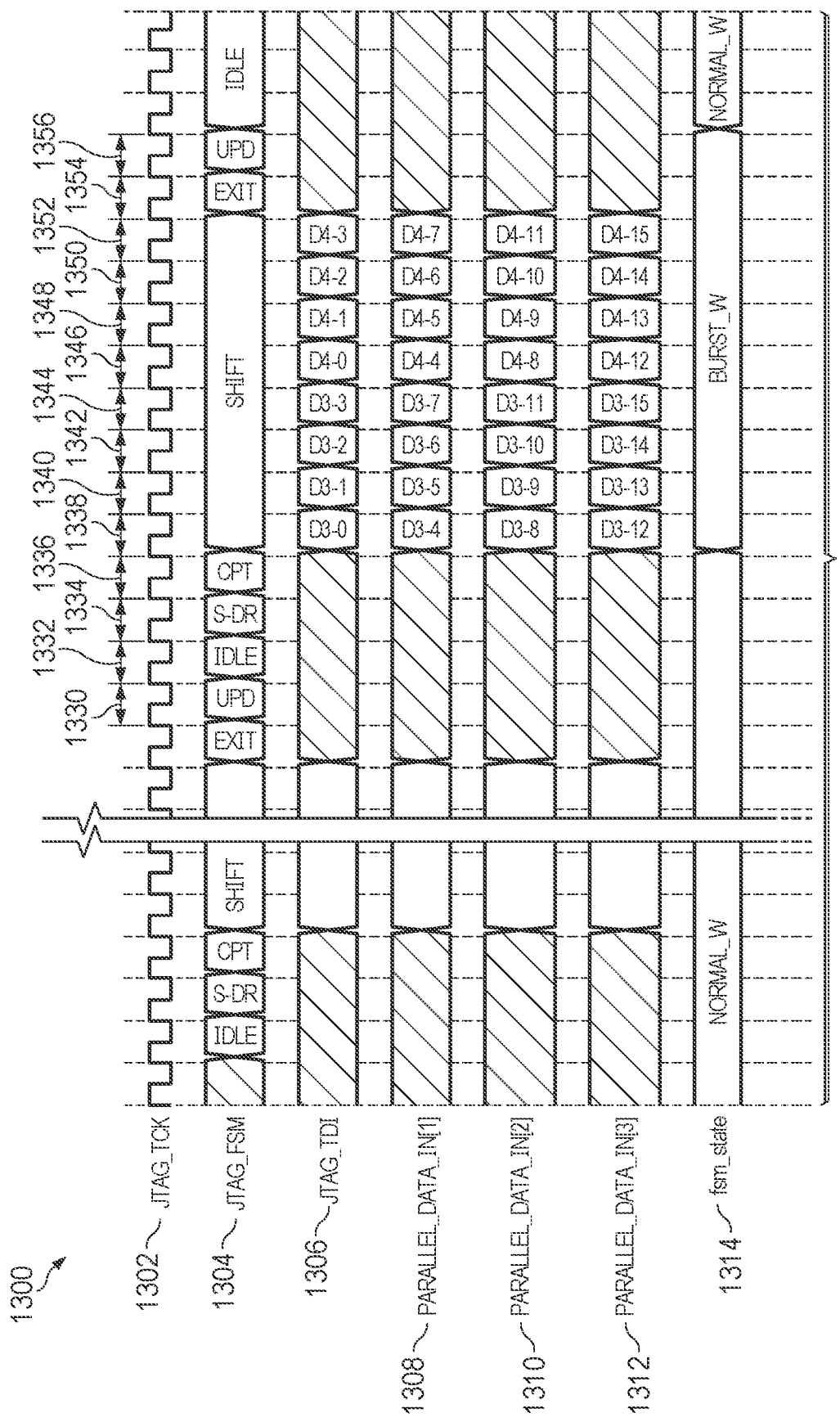
FIGS. 13A-B illustrate an embodiment method for writing a RAM via a serial test data input pin and parallel data loading pins.
Figure 13B:
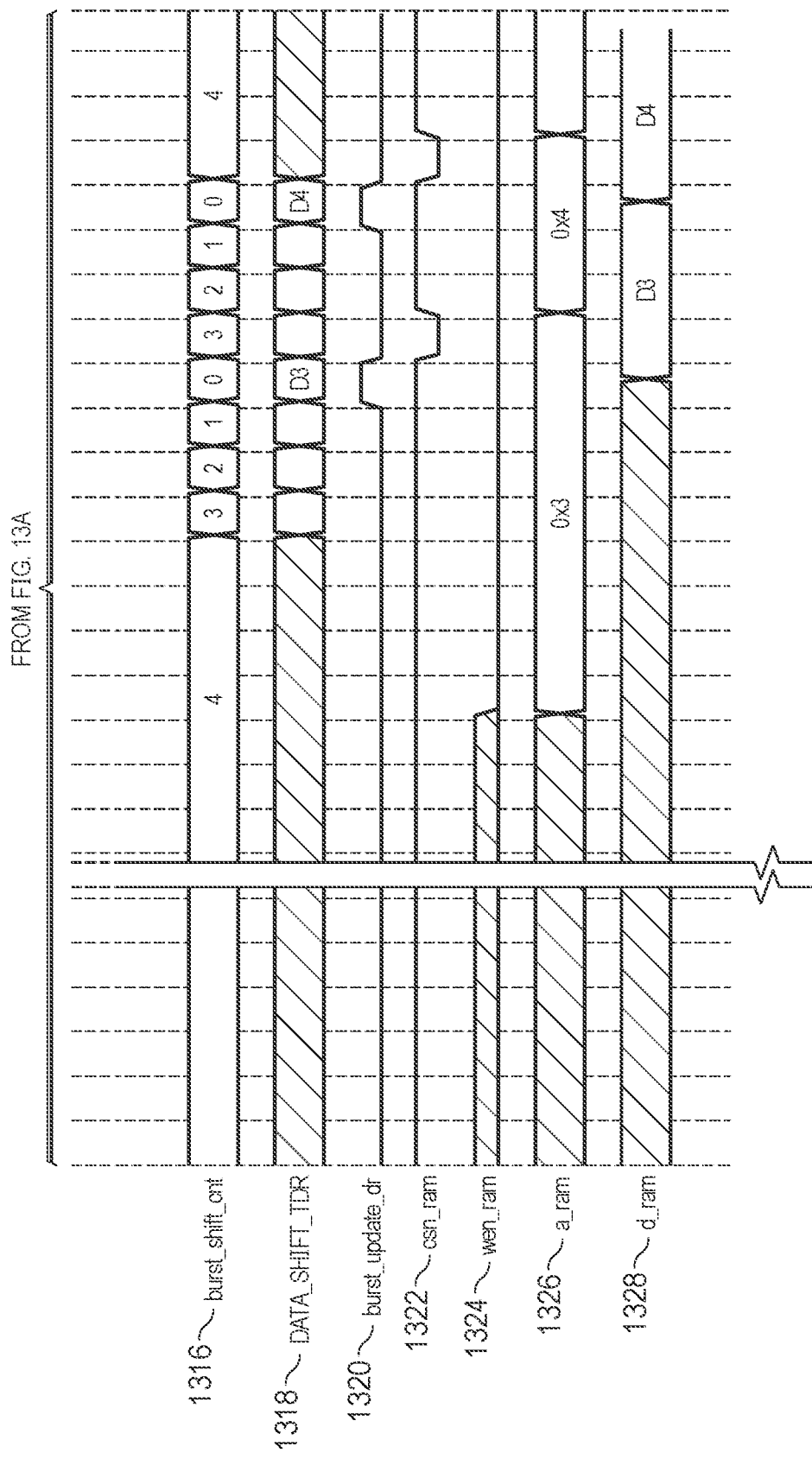

FIGS. 13A-B illustrate an embodiment method for writing a RAM via a serial test data input pin and parallel data loading pins. The signals and waveforms depicted in FIGS. 13A-B may correspond to writing data from a serial test data input pin and 3 parallel data loading pins to a RAM by a RAM access circuit. The RAM access circuit may include a flexible RAM loader and a control circuit coupled to the flexible RAM loader. The flexible RAM loader may be one of those described in U.S. patent application Ser. No. 17/580,458. The control circuit may be implemented based on the embodiment techniques proposed in the present disclosure.

In this example, the RAM's data width is 16-bit. The parallel factor is 4 (one serial test data input pin+three parallel data loading pins). FIGS. 13A-B illustrate a clock signal 1302, a JTAG FSM signal 1304, and a serial test data input signal 1306. Parallel data signals 1308, 1310, and 1312 depict data received from the three parallel data loading pins respectively. FIGS. 13A-B also illustrate a state signal 1314, a counter signal 1316, and a shift register signal 1318. A burst update signal 1320 is generated by the control circuit. The burst update signal 920 is a pulse signal containing at least one pulse configured to trigger a RAM write operation. A CSN signal 1322, a RAM write enable bit 1324, a RAM address signal 1326, and a RAM data signal 1328 are also shown in FIGS. 13A-B.

The RAM access circuit may use the serial test data input pin and the three parallel data loading pins for parallel data loading. Data blocks D3 and D4 are to be loaded to the RAM. Both D3 and D4 have 16 bits. The RAM access circuit runs in NORMAL_W mode before clock cycle 1338. The first RAM write operation is triggered by an UPDATE signal (not shown in FIGS. 13A-B) at clock cycle 1330. As such, the start address 0x3 is loaded to the RAM address signal 1326 at the subsequent clock cycle 1332.

The RAM access circuit changes to BURST_W mode during clock cycles 1338-1352. During these clock cycles, RAM write operations may be triggered by the burst update signal 1320 generated by the control circuit. Pulses in the burst update signal 1320 are produced in accordance with the counter. As shown in FIGS. 13A-B, an initial value of the counter is set to 4, which is equal to the data width of the RAM divided by the parallel factor. During clock cycles 1338-1352, the test controller moves to and stays in a SHIFT-DR state. Thus, data blocks D3 and D4 are loaded to the shift register as shown in the serial test data input signal 1306 and the parallel data signals 1308, 1310, and 1312. When the test controller moves to the SHIFT-DR state at clock cycle 1338, the counter is activated and counts down by 1 after each clock cycle. At clock cycle 1346, the entire data block D3 is loaded into the shift register. At the same clock cycle, the counter becomes 0, which triggers the control circuit to produce a pulse in the burst update signal 1320. The pulse triggers the second RAM write operation in the next clock cycle 1348. The CSN signal 1322 changes from high to low to allow access to the RAM. The second RAM write operation loads the data block D3 from the shift register to the system RAM. The second RAM write operation may include transferring the data block D3 stored in the shift register to an update register (such as the update register 204 in FIG. 2 or the update register 612 in FIG. 6), and then transferring the data from the update register to the RAM.

During clock cycles 1346-1352, the test controller is still in the SHIFT-DR state. Thus, the subsequent data block D4 can be loaded from the serial test data input pin to the shift register without any delay. At clock cycle 1348, the counter resets to 3 and starts counting down again. At clock cycle 1354, the counter becomes 0, and once again triggers the control circuit to produce another pulse in the burst update signal 1320. By the end of the clock cycle 1354, the transfer of the data block D4 from the serial test data input pin and the parallel data loading pins to the shift register has been completed. The pulse in the burst update signal 1320 at clock cycle 1354 triggers the third RAM write operation in clock cycle 1356. The third RAM write operation loads the data block D4 from the shift register to the system RAM. Similar to the second RAM write operation, the third RAM write operation may also include transferring the data block D4 stored in the shift register to the update register, and then transferring the data from the update register to the RAM.

Figure 14A:
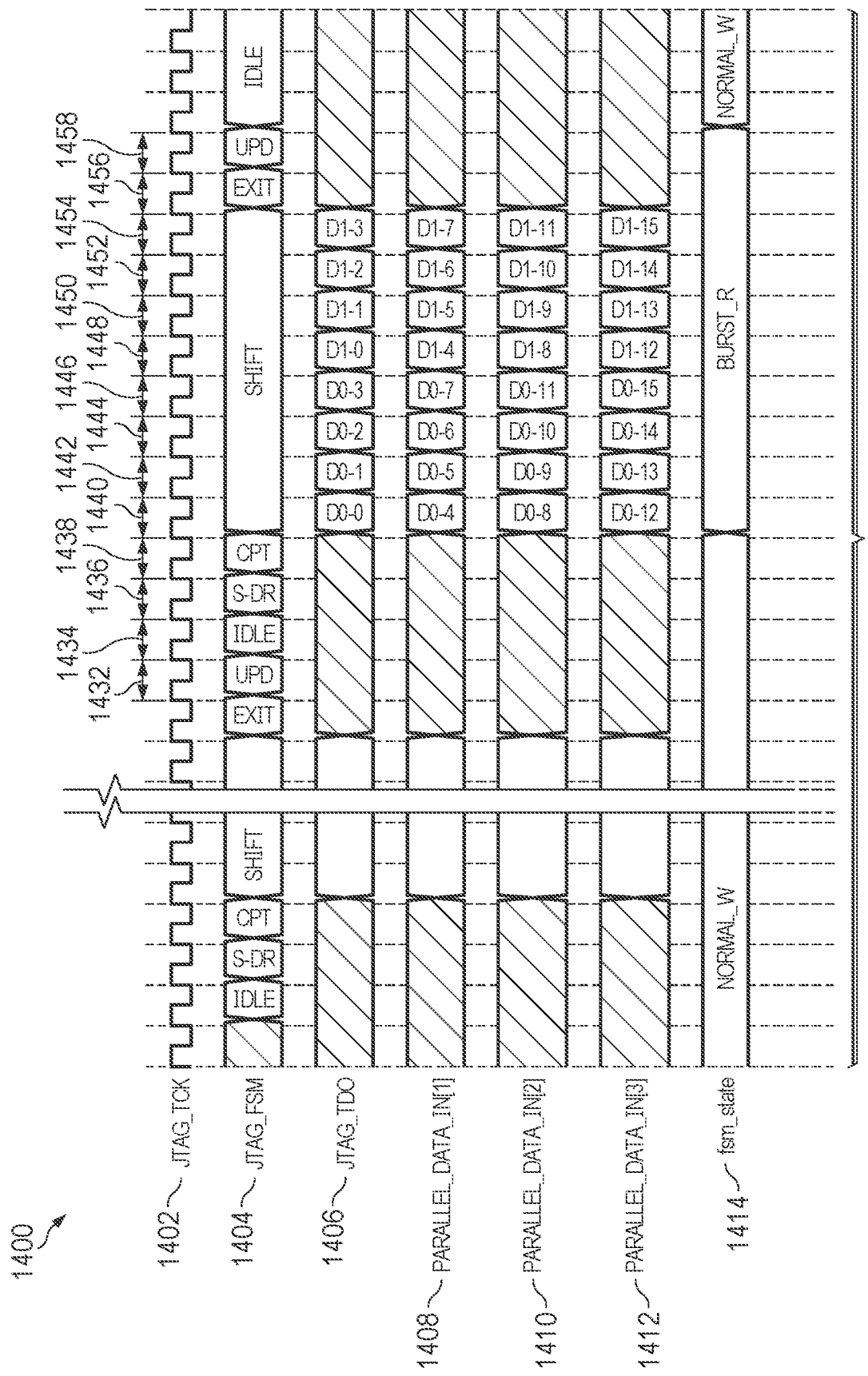
FIGS. 14A-B illustrate an embodiment method for reading a RAM via a serial test data output pin and parallel data loading pins.
Figure 14B:
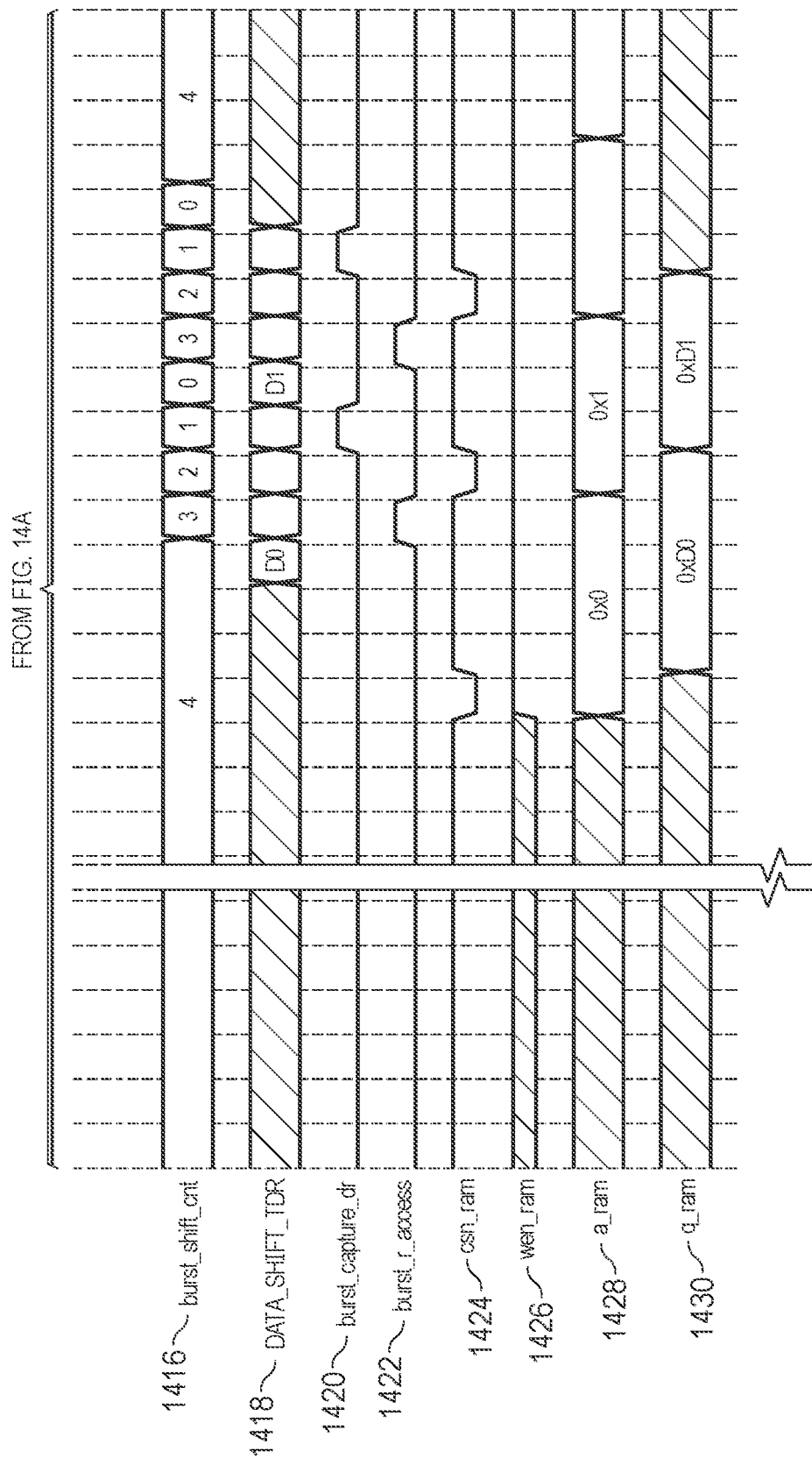

FIGS. 14A-B illustrate an embodiment method for reading a RAM via a serial test data output pin and parallel data loading pins. The signals and waveforms depicted in FIGS. 14A-B may correspond to reading data from a RAM via a serial test data output pin and 3 parallel data loading pins by a RAM access circuit. The RAM access circuit may include a flexible RAM loader and a control circuit coupled to the flexible RAM loader. The flexible RAM loader may be one of those described in U.S. patent application Ser. No. 17/580,458. The control circuit may be implemented based on the embodiment techniques proposed in the present disclosure.

In this example, the RAM's data width is 16-bit. The parallel factor is 4 (one serial test data output pin+three parallel data loading pins). FIGS. 14A-B illustrate a clock signal 1402, a JTAG FSM signal 1404, and a serial test data out signal 1406. Parallel data signals 1408, 1410, and 1412 depict data transferred to the three parallel data loading pins respectively. FIGS. 14A-B also illustrate a state signal 1414, a counter signal 1416, and a shift register signal 1418. A burst capture signal 1420 and a burst read access signal 1422 are two pulse signals generated by the control circuit. The burst capture signal 1420 is configured to trigger the shift register to shift data to the test data output. The burst read access signal 1422 is configured to trigger a RAM read operation. A CSN signal 1424, a RAM write enable bit 1426, a RAM address signal 1428, and a RAM data signal 1430 are also shown in FIGS. 14A-B.

The RAM access circuit may use the serial test data output pin and the three parallel data loading pins for parallel data loading. The RAM access circuit is reading data blocks Do and Do located at addresses 0x0 and 0x1 of the RAM. Do and Di both have 16 bits. The RAM access circuit runs in NORMAL_W mode before clock cycle 1440. At clock cycle 1432, the test controller moves to an UPDATE-DR state and generates an UPDATE signal (not shown in FIGS. 14A-B). The UPDATE signal triggers the first RAM read operation at clock cycle 1434, which loads the data block Do from the RAM to the shift register. At clock cycle 1438, the test controller moves to a CAPTURE-DR state and generates a CAPTURE signal. The CAPTURE signal triggers the shift register to shift Do to the serial test data output pin and the parallel data loading pins during clock cycles 1440-1446. The test controller stays in the SHIFT-DR state during clock cycles 1440-1454.

As shown in FIGS. 14A-B, an initial value of the counter is set to 4, which is equal to the data width of the RAM divided by the parallel factor. At clock cycle 1440, the running mode of the RAM access circuit changes to BURST_R, which activates the counter. The counter starts to count down by 1 after each clock cycle. At clock cycle 1442, the counter becomes 3, which triggers the control circuit to generate a pulse in the burst read access signal 1422. This pulse triggers the second RAM read operation at clock cycle 1444, which loads the data block Di from the RAM to the shift register. The second RAM read operation may include transferring Di from the RAM to the update register and subsequently transferring Di from the update register to the shift register. At clock cycle 1446, the entire data block Do is shifted from the shift register to the serial test data output and the parallel data loading pins. At the same clock cycle, the counter becomes 1, which triggers the control circuit to produce a pulse in the burst capture signal 1420. This pulse in the burst capture signal 1420 at clock cycle 1446 triggers the shift register to shift the data block Di to the serial test data output and the parallel data loading pins, which takes 4 clock cycles 1448-1454.

A RAM access circuit may be used to load data directly from peripheral devices to a RAM. The peripheral devices include a general purpose input and output (GPIO) controller, a digital to analog converter (DAC), an analog to digital converter (ADC), a serial communication controller, a direct memory access (DMA) controller, and so on. This situation may be called external loading. In various embodiments, the RAM access circuit for external loading include a test data input. The test data input may include at least one parallel data loading pins coupled to outputs of a peripheral. The parallel factor is a number of the at least one parallel data loading pin.

Figure 15A:
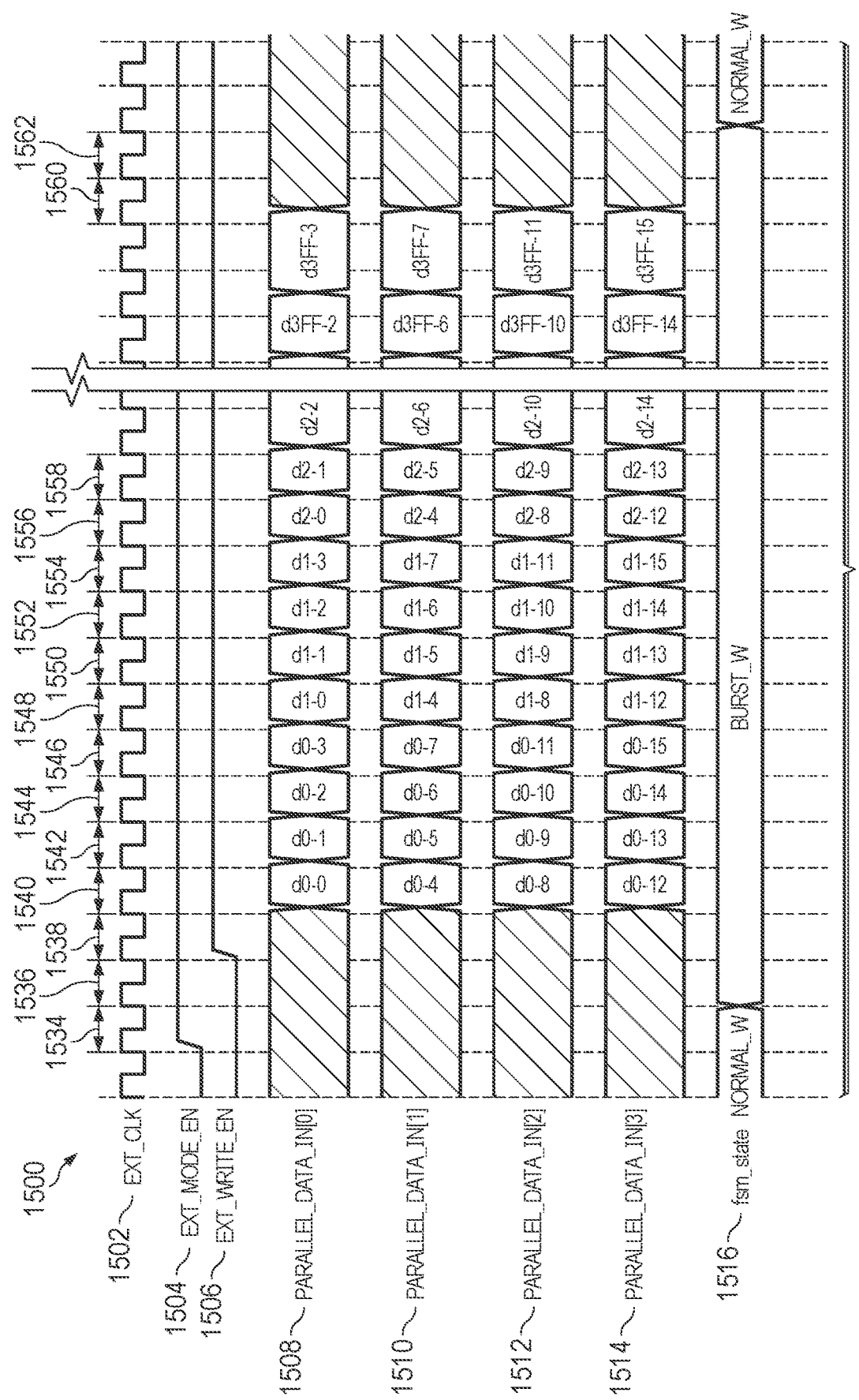
FIGS. 15A-B illustrate an embodiment method for writing a RAM using external loading.
Figure 15B:
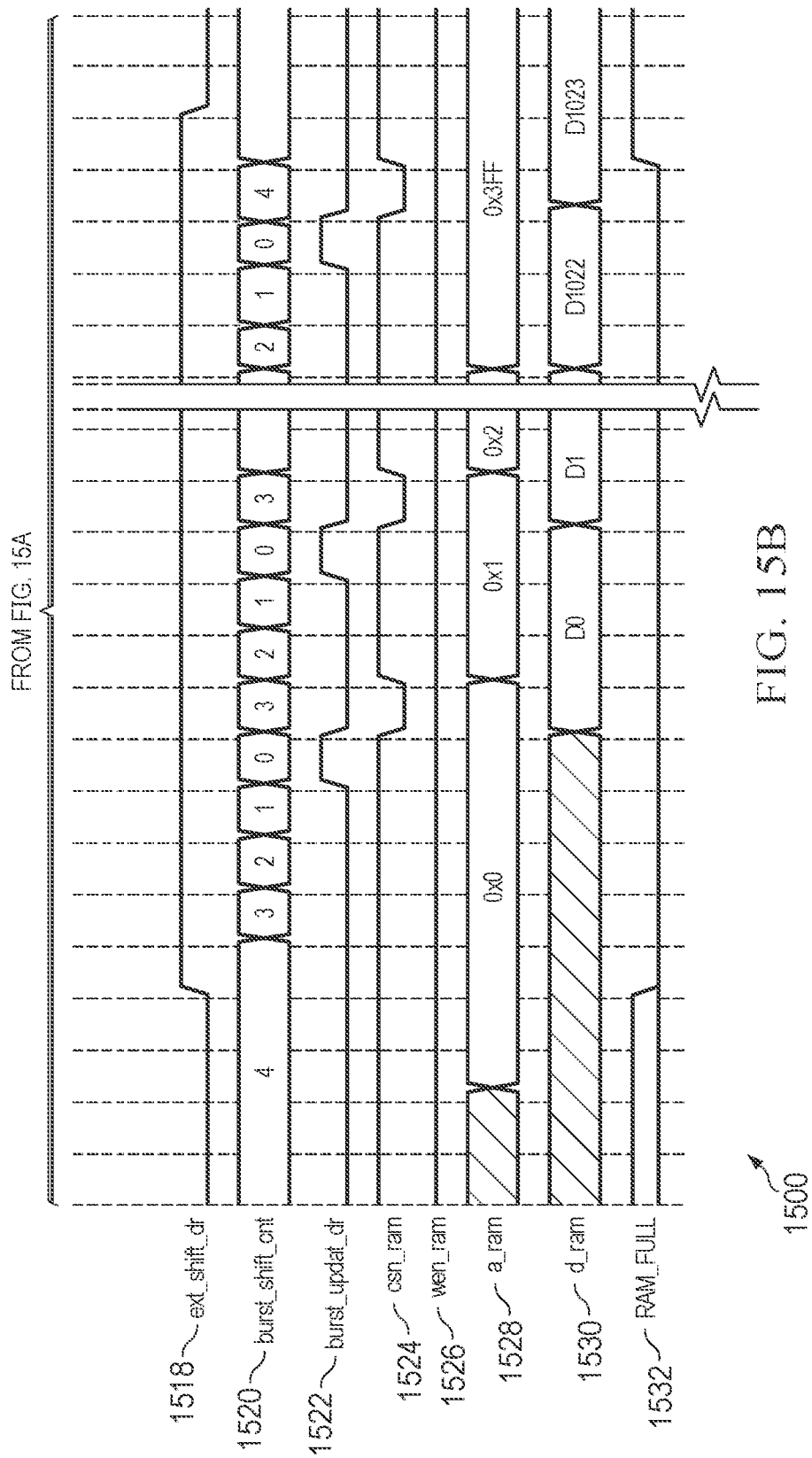

FIGS. 15A-B illustrate an embodiment method for writing a RAM using external loading. The signals and waveforms depicted in FIGS. 15A-B may correspond to writing data from a peripheral to a RAM by a RAM access circuit. The RAM access circuit may be the RAM access circuit 500 in FIG. 5 or any other devices in consistent with the embodiment techniques proposed in the present disclosure. The RAM access circuit may further include a control circuit configured to produce external loading control signals in accordance with a counter. In this example, the peripheral has four outputs. The test data input of the RAM access circuit includes four parallel data loading pins. Each of the four parallel data loading pins is coupled to one output of the peripheral. A data width of the RAM is 16-bit. Thus, the parallel factor is 4.

FIGS. 15A-B depict several external loading control signals. An external mode enable signal 1504 indicates whether or not the external loading mode is enabled. An external write enable signal 1506 indicates whether or not the write operation is enabled. In addition, a rising edge of the external write enable signal 1506 triggers the start of data loading from the outputs of the peripheral to the shift register. An external shift signal 1518 may emulate the SHIFT-DR state of a JTAG RAM loader and trigger shifting data to the shift register. A burst update signal 1522 is configured to trigger a RAM write operation. A RAM full signal 1532 indicates whether or not all addresses of the RAM have been written to.

Parallel data signals 1508-1514 illustrate data received from each of the four parallel data loading pins. FIGS. 15A-B also show a state signal 1516, a counter signal 1520, a CSN signal 1524, a RAM write enable bit 1526, a RAM address signal 1528, and a RAM data signal 1530.

In this example, data may keep coming from the peripheral. The RAM access circuit is configured to load the data from the peripheral to the RAM (starting from RAM address 0x0) till the RAM is full. The RAM access circuit is running in NORMAL_W mode initially. At clock cycle 1534, the external mode enable signal 1504 switches from low to high, which indicate that the external mode is enabled. In the next clock cycle 1536, the RAM access circuit runs in BURST_W mode. In clock cycle 1538, the external write enable signal 1506 changes from low to high. Triggered by the rising edge of the external write enable signal 1506, the external shift signal 1518 changes from low to high at clock cycle 1540, the start address is set to 0x0 in the RAM address signal 1528, and the RAM full signal 1532 is reset to low indicating the RAM is not full. The first RAM write operation may occur to set the start address. The parallel data signals 1508-1514 show that data loading from the outputs of the peripheral to the shift register starts at clock cycle 1540.

As shown in FIGS. 15A-B, an initial value of the counter is set to 4, which is equal to the data width of the RAM divided by the parallel factor. When the data loading starts at clock cycle 1540, the counter is activated and counts down by 1 after each clock cycle. At clock cycle 1548, the entire data block Do is loaded into the shift register. At the same clock cycle, the counter becomes 0, which triggers the control circuit to produce a pulse in the burst update signal 1522. The pulse triggers the second RAM write operation in the next clock cycle 1550. The CSN signal 1524 changes from high to low to allow access to the RAM. The second RAM write operation loads the data block Do from the shift register to the RAM. The second RAM write operation may include transferring the data block Do stored in the shift register to an update register (such as the update register 204 in FIG. 2 or the update register 612 in FIG. 6), and then transferring the data from the update register to the RAM. The RAM address signal is incremented by 1 automatically after each RAM access.

During clock cycles 1548-1554, the external shift signal 1518 is still at high level. Thus, the subsequent data block Di is loaded from the four parallel data loading pins to the shift register. At clock cycle 1550, the counter resets to 3 and starts counting down again. At clock cycle 1556, the counter becomes 0, and once again triggers the control circuit to produce another pulse in the burst update signal 1522. By the end of the clock cycle 1556, the transfer of the data block Di from four parallel data loading pins to the shift register has been completed. The pulse in the burst update signal 1522 at clock cycle 1556 triggers the third RAM write operation in clock cycle 1558. The third RAM write operation loads the data block Di from the shift register to the system RAM. Similar to the second RAM write operation, the third RAM write operation may also include transferring the data block Di stored in the shift register to the update register, and then transferring the data from the update register to the RAM.

In this example, the RAM's size is 2 kB (2*1024 Bytes). Each data block has 16 bits. Thus, after 1024 (0x400) data blocks are loaded into the RAM at the end of clock cycle

1560, the RAM becomes full. In the next clock cycle 1562, the RAM full signal 1532 is set to high, which terminates this external data loading.

Figure 16:
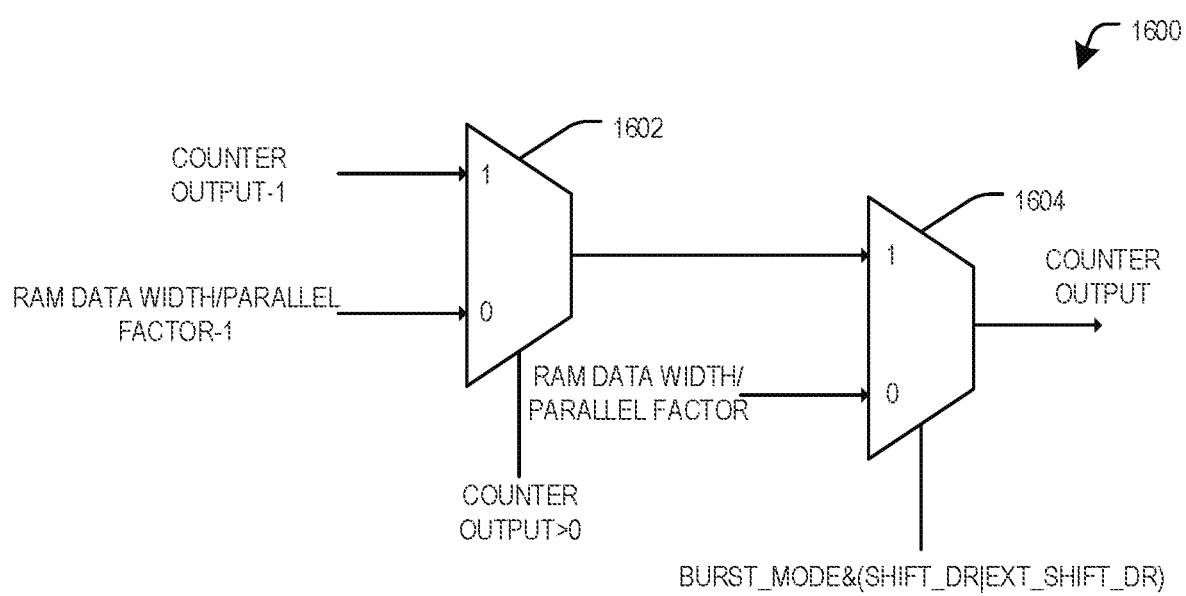
FIG. 16 illustrates an embodiment implementation of a counter used for external loading.

FIG. 16 illustrates an embodiment implementation of a counter used for external loading. As shown in FIG. 16, the counter may be implemented as a shift counter 1600. The shift counter 1600 may include two multiplexers 1602 and 1604 coupled together. The multiplexer 1602 has two inputs: output of the shift counter 1600 and N-1. N is the integer described above, which is equal to the data width of the RAM divided by the parallel factor. If the output of the shift counter 1600 is larger than 0, the multiplexer 1602 outputs the output of the shift counter 1600-1. Otherwise, the multiplexer 1602 outputs N-1. The multiplexer 1602's output is coupled to one input of the multiplexer 1604. The other input of the multiplexer 1604 is N. The output of the multiplexer 1604 may depend on whether the RAM access circuit is running in BURST mode, whether the test controller is in the SHIFT-DR state, and the status of the external shift signal (such as the external shift signal 1518 in FIGS. 15A-B).

Figure 17:
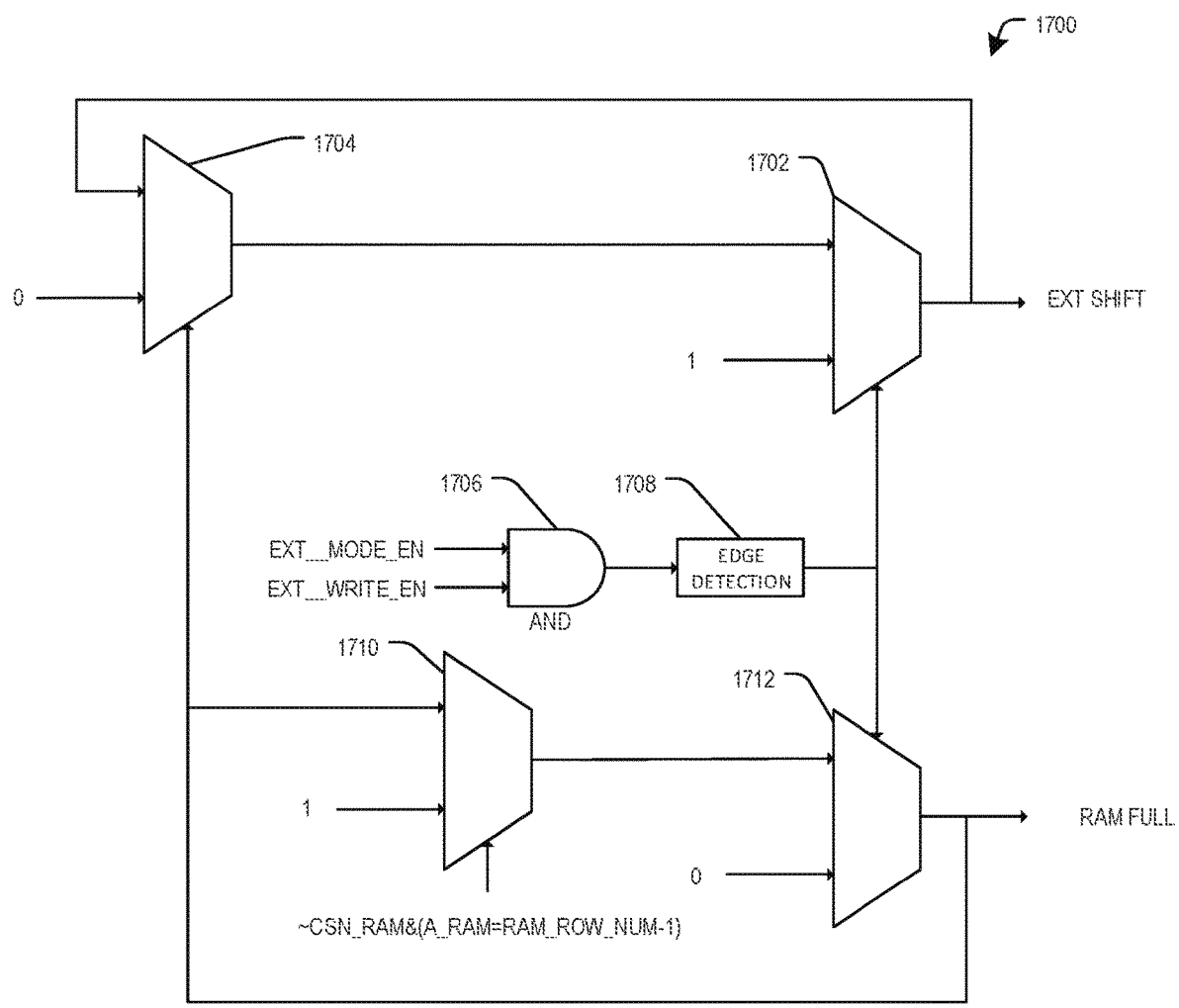
FIG. 17 illustrates an embodiment implementation of a control circuit used for external loading.

FIG. 17 illustrates an embodiment implementation of a control circuit used for external loading. As shown in FIG. 17, the control circuit 1700 includes four multiplexers 1702, 1704, 1710, and 1712, an AND gate 1706, and an edge detection circuit 1708. Two external loading control signals are produced by the control circuit 1700: the external shift signal and the RAM full signal. The multiplexer 1702 outputs the external shift signal. One input of the multiplexer 1702 is 1, and the other input is the multiplexer 1704's output. The multiplexer 1702 is controlled by the edge detection circuit 1708's output. The multiplexer 1712 outputs the RAM full signal. One input of the multiplexer 1712 is 0, and the other input is the multiplexer 1710's output. The multiplexer 1712 also is controlled by the edge detection circuit 1708's output. The edge detection circuit 1708 is coupled to output of the AND gate 1706. The AND gate 1706 has two inputs: the external mode enable signal and the external write enable signal. The multiplexer 1704 has two inputs: 0 and the multiplexer 1702's output and is controlled by the multiplexer 1712's output. The multiplexer 1710 has two inputs: 1 and the multiplexer 1712's output. The multiplexer 1710 is controlled by the CSN signal and the RAM address signal as illustrated in FIG. 17.

Figure 18A:
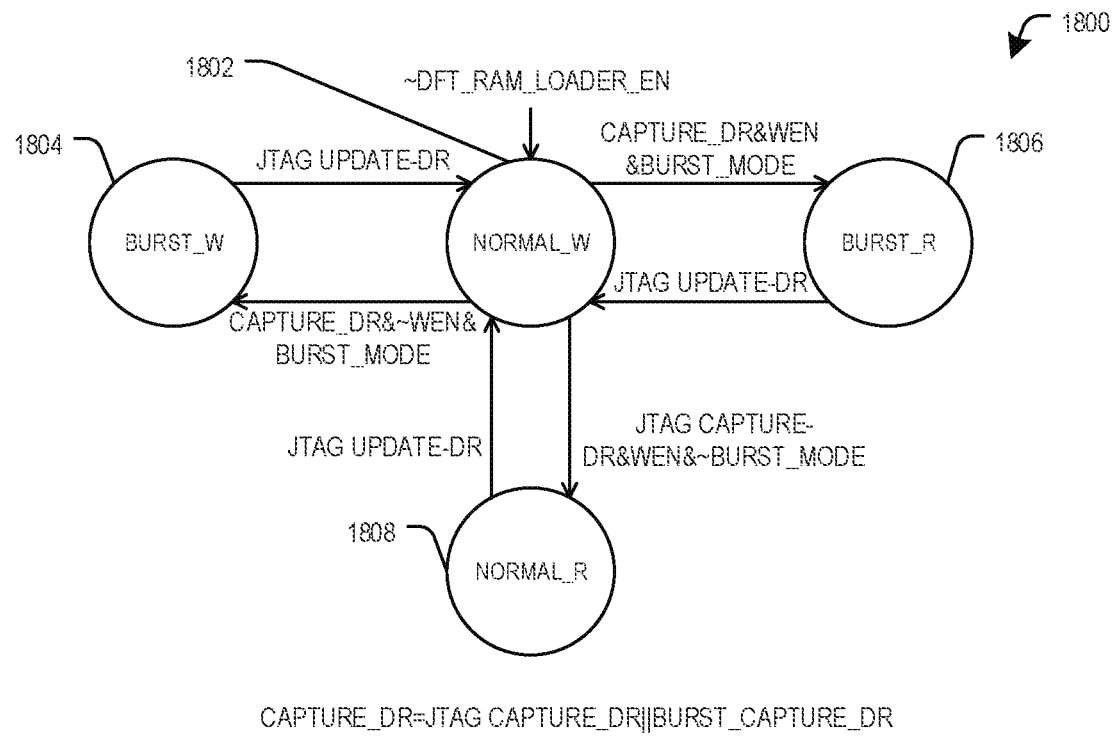
FIGS. 18A-B illustrate state transitions of embodiment RAM access circuits.

FIG. 18A illustrates a state transition of an embodiment RAM access circuit. The state transition 1800 corresponds to the RAM access circuit 602 in FIG. 6. The RAM access circuit has four running modes: a NORMAL_W state 1802, a NORMAL_R state 1808, a BURST_W state 1804, and a BURST_R state 1806. NORMAL_W means that control signals from the test controller are configured to trigger RAM write operations. The test controller may be a JTAG test controller that runs in consistent with an IEEE 1149.1 standard. NORMAL_R means that control signals from the test controller are configured to trigger RAM read operations. BURST_W means that signals generated by a control circuit (such as the control circuit 614 in FIG. 6) are configured to trigger RAM write operations. BURST_R means that signals generated by the control circuit are used to trigger RAM read operations.

As shown in FIG. 18A, a DFT RAM loader enable (DFT_RAM_LOADER_EN) signal may be used to enable the entire logic. Once the entire logic is enabled, the RAM access circuit moves to the NORMAL_W state. The NORMAL_W state is an initial state because this state allows the RAM access circuit to write in a single address.

Figure 18B:
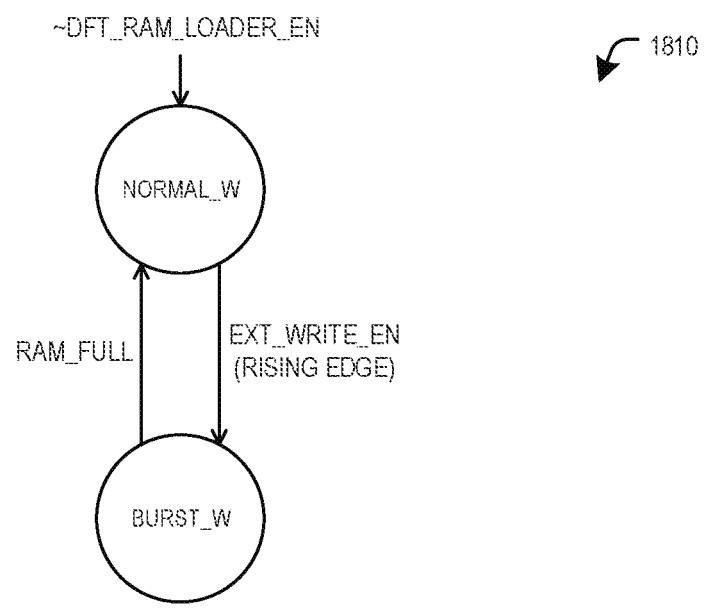

FIG. 18B illustrates a state transition of an embodiment RAM access circuit for external loading. The state transition 1810 corresponds to an embodiment RAM access circuit configured to load data from a peripheral device (such as the RAM access circuit used in FIGS. 15A-B). As shown in FIG. 18B, when the entire logic is enabled, the RAM access circuit moves to the initial state NORMAL_W. The rising edge of the external write enable signal triggers the RAM access circuit to change to the BURST_W state. When the RAM is full (triggered by the RAM full signal or when the RAM full flag is asserted), the RAM access circuit returns back to the NORMAL_W state.

Example embodiments of the invention are summarized here. Other embodiments can also be understood from the entirety of the specification as well as the claims filed herein.

Example 1. A circuit for reading or writing a RAM, the circuit including: a shift register coupled to the RAM, a test data input, and a test data output; and a control circuit configured to generate a pulse every N clock cycles, each pulse triggering a RAM access operation transferring data between the shift register and the RAM, N being equal to a data width of the RAM divided by a parallel factor, the parallel factor being a number of pins in either the test data input or the test data output configured for parallel data loading.

Example 2. The circuit of Example 1, wherein the control circuit is configured to generate each pulse in accordance with a counter repeating every N clock cycles.

Example 3. The circuits of Example 1 and Example 2, further coupled to a test controller running a finite state machine in accordance with an IEEE 1149.1 standard.

Example 4. The circuits of Example 1 through Example 3, wherein the counter is configured to activate and count in accordance with the finite state machine.

Example 5. The circuits of Example 1 through Example 4, further including an update register, wherein the RAM access operation includes a data transfer between the shift register and the update register and a data transfer between the update register and the RAM.

Example 6. The circuits of Example 1 through Example 5, wherein the test data input is a serial test data input pin and the test data output is a serial test data output pin, and wherein the parallel factor is 1.

Example 7. The circuits of Example 1 through Example 6, wherein the test data input includes a serial test data input pin and at least one parallel data loading pin, wherein the test data output includes a serial test data output pin and the at least one parallel data loading pin, each of the at least one parallel data loading pin coupled to a section of the shift register via a MUX, and wherein the parallel factor is a number of the at least one parallel data loading pin+1.

Example 8. The circuits of Example 1 through Example 7, wherein the test data input includes at least one parallel data loading pin coupled to a peripheral device, and wherein the parallel factor is a number of the at least one parallel data loading pin.

Example 9. A method to write a RAM, the method including: loading, by a RAM access circuit coupled to the RAM, data from a test data input into a shift register of the RAM access circuit; and generating, by the RAM access circuit, a pulse every N clock cycles, each pulse triggering a RAM write operation transferring the data loaded into the shift register to the RAM, N being equal to a data width of the RAM divided by a parallel factor, the parallel factor being a number of pins in the test data input configured for parallel data loading.

Example 10. The method of Example 9, wherein the RAM access circuit is configured to generate each pulse in accordance with a counter repeating every N clock cycles.

Example 11. The methods of Example 9 and Example 10, wherein the RAM access circuit is coupled to a test controller running a finite state machine in accordance with an IEEE 1149.1 standard.

Example 12. The methods of Example 9 through Example 11, wherein the counter is configured to activate and count in accordance with the finite state machine.

Example 13. The methods of Example 9 through Example 12, wherein the RAM access circuit includes an update register, and wherein the RAM write operation includes transferring the data from the shift register to the update register and subsequently transferring the data from the update register to the RAM.

Example 14. The methods of Example 9 through Example 13, wherein the test data input is a serial test data input pin, and wherein the parallel factor is 1.

Example 15. The methods of Example 9 through Example 14, wherein the test data input includes a serial test data input pin and at least one parallel data loading pin, each of the at least one parallel data loading pin coupled to a section of the shift register via a MUX, and wherein the parallel factor is a number of the at least one parallel data loading pin+1.

Example 16. The methods of Example 9 through Example 15, wherein the test data input includes at least one parallel data loading pin coupled to a peripheral device, and wherein the parallel factor is a number of the at least one parallel data loading pin.

Example 17. A method to read a RAM, the method including: generating, by a RAM access circuit coupled to the RAM and a test data output, a pulse every N clock cycles, each pulse triggering a RAM read operation loading data from the RAM into a shift register of the RAM access circuit, N being equal to a data width of the RAM divided by a parallel factor, the parallel factor being a number of pins in the test data output configured for parallel data loading; and transferring, by the RAM access circuit, the data loaded into the shift register to the test data output.

Example 18. The method of Example 17, wherein the RAM access circuit includes an update register, and wherein the RAM read operation includes transferring the data from the RAM to the update register and subsequently transferring the data from the update register to the shift register.

Example 19. The methods of Example 17 and Example 18, wherein the test data output includes a serial test data output pin and at least one parallel data loading pin, each of the at least one parallel data loading pin coupled to a section of the shift register via a MUX, and wherein the parallel factor is a number of the at least one parallel data loading pin+1.

Example 20. The methods of Example 17 through Example 19, wherein the RAM access circuit is configured to generate each pulse in accordance with a counter repeating every N clock cycles.

Example 21. A device including: a RAM; a processor; and a RAM access circuit including: a shift register coupled to the RAM, a test data input, and a test data output; and a control circuit configured to generate a pulse every N clock cycles, each pulse triggering a RAM access operation transferring data between the shift register and the RAM, N being equal to a data width of the RAM divided by a parallel factor, the parallel factor being a number of pins in either the test data input or the test data output configured for parallel data loading.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit for reading or writing a random access memory (RAM), the circuit comprising:
    a shift register coupled to the RAM, a test data input, and a test data output; and
    a control circuit configured to generate a pulse every N clock cycles, each pulse triggering a RAM access operation transferring data between the shift register and the RAM, N being equal to a data width of the RAM divided by a parallel factor, the parallel factor being a number of pins in either the test data input or the test data output configured for parallel data loading.

2. The circuit of claim 1, wherein the control circuit is configured to generate each pulse in accordance with a counter repeating every N clock cycles.

3. The circuit of claim 2, further coupled to a test controller running a finite state machine in accordance with an IEEE 1149.1 standard.

4. The circuit of claim 3, wherein the counter is configured to activate and count in accordance with the finite state machine.

5. The circuit of claim 3, further comprising an update register, wherein the RAM access operation includes a data transfer between the shift register and the update register and a data transfer between the update register and the RAM.

6. The circuit of claim 3, wherein the test data input is a serial test data input pin and the test data output is a serial test data output pin, and wherein the parallel factor is 1.

7. The circuit of claim 3, wherein the test data input includes a serial test data input pin and at least one parallel data loading pin, wherein the test data output includes a serial test data output pin and the at least one parallel data loading pin, each of the at least one parallel data loading pin coupled to a section of the shift register via a multiplexer (MUX), and wherein the parallel factor is a number of the at least one parallel data loading pin+1.

8. The circuit of claim 1, wherein the test data input includes at least one parallel data loading pin coupled to a peripheral device, and wherein the parallel factor is a number of the at least one parallel data loading pin.

9. A method to write a random access memory (RAM), the method comprising:
    loading, by a RAM access circuit coupled to the RAM, data from a test data input into a shift register of the RAM access circuit; and
    generating, by the RAM access circuit, a pulse every N clock cycles, each pulse triggering a RAM write operation transferring the data loaded into the shift register to the RAM, N being equal to a data width of the RAM divided by a parallel factor, the parallel factor being a number of pins in the test data input configured for parallel data loading.

10. The method of claim 9, wherein the RAM access circuit is configured to generate each pulse in accordance with a counter repeating every N clock cycles.

11. The method of claim 10, wherein the RAM access circuit is coupled to a test controller running a finite state machine in accordance with an IEEE 1149.1 standard.

12. The method of claim 11, wherein the counter is configured to activate and count in accordance with the finite state machine.

13. The method of claim 11, wherein the RAM access circuit includes an update register, and wherein the RAM write operation includes transferring the data from the shift register to the update register and subsequently transferring the data from the update register to the RAM.

14. The method of claim 11, wherein the test data input is a serial test data input pin, and wherein the parallel factor is 1.

15. The method of claim 11, wherein the test data input includes a serial test data input pin and at least one parallel data loading pin, each of the at least one parallel data loading pin coupled to a section of the shift register via a multiplexer (MUX), and wherein the parallel factor is a number of the at least one parallel data loading pin+1.

16. The method of claim 9, wherein the test data input includes at least one parallel data loading pin coupled to a peripheral device, and wherein the parallel factor is a number of the at least one parallel data loading pin.

17. A method to read a random access memory (RAM), the method comprising:

generating, by a RAM access circuit coupled to the RAM and a test data output, a pulse every N clock cycles, each pulse triggering a RAM read operation loading data from the RAM into a shift register of the RAM access circuit, N being equal to a data width of the RAM divided by a parallel factor, the parallel factor being a number of pins in the test data output configured for parallel data loading; and transferring, by the RAM access circuit, the data loaded into the shift register to the test data output.

18. The method of claim 17, wherein the RAM access circuit includes an update register, and wherein the RAM read operation includes transferring the data from the RAM to the update register and subsequently transferring the data from the update register to the shift register.

19. The method of claim 17, wherein the test data output includes a serial test data output pin and at least one parallel data loading pin, each of the at least one parallel data loading pin coupled to a section of the shift register via a multiplexer (MUX), and wherein the parallel factor is a number of the at least one parallel data loading pin+1.

20. The method of claim 17, wherein the RAM access circuit is configured to generate each pulse in accordance with a counter repeating every N clock cycles.

21. A device comprising:
a random access memory (RAM);
a processor; and
a RAM access circuit comprising:
a shift register coupled to the RAM, a test data input, and a test data output; and
a control circuit configured to generate a pulse every N clock cycles, each pulse triggering a RAM access operation transferring data between the shift register and the RAM, N being equal to a data width of the RAM divided by a parallel factor, the parallel factor being a number of pins in either the test data input or the test data output configured for parallel data loading.

* * * * *